(12) United States Patent
Kim et al.

(10) Patent No.: US 10,346,097 B2
(45) Date of Patent: *Jul. 9, 2019

(54) NONVOLATILE MEMORY DEVICE AND STORAGE DEVICE INCLUDING NONVOLATILE MEMORY DEVICE

(71) Applicant: SAMSUNG ELECTRONICS CO., LTD., Suwon-si, Gyeonggi-Do OT (KR)

(72) Inventors: Ji-Suk Kim, Seoul (KR); Jung-Yun Yun, Seoul (KR); Bongsoon Lim, Seoul (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 12 days.

This patent is subject to a terminal disclaimer.

(21) Appl. No.: 15/360,661

(22) Filed: Nov. 23, 2016

(65) Prior Publication Data

US 2017/0154685 A1  Jun. 1, 2017

(30) Foreign Application Priority Data

Nov. 26, 2015 (KR) .................. 10-2015-0166119
Feb. 29, 2016 (KR) .................. 10-2016-0024580

(51) Int. Cl.
| | | |
|---|---|---|
| *G11C 16/04* | (2006.01) | |
| *G06F 3/06* | (2006.01) | |
| *G11C 11/56* | (2006.01) | |
| *G11C 16/34* | (2006.01) | |
| *G11C 16/08* | (2006.01) | |
| *G11C 16/10* | (2006.01) | |
| *G11C 16/32* | (2006.01) | |

(52) U.S. Cl.
CPC ........ *G06F 3/0679* (2013.01); *G11C 11/5628* (2013.01); *G11C 16/08* (2013.01); *G11C 16/10* (2013.01); *G11C 16/3459* (2013.01); *G11C 16/32* (2013.01)

(58) Field of Classification Search
CPC .... G11C 16/3431; G06F 3/061; G06F 3/0659
USPC ............. 365/185.02, 185.18, 185.23, 185.03
See application file for complete search history.

(56) References Cited

U.S. PATENT DOCUMENTS

| | | |
|---|---|---|
| 6,687,158 B2 | 2/2004 | Yano |
| 7,023,741 B2 | 4/2006 | Nakamura et al. |
| 7,502,255 B2 * | 3/2009 | Li ..................... G11C 11/5628 365/185.03 |
| 7,679,133 B2 | 3/2010 | Son et al. |
| 7,876,613 B2 | 1/2011 | Kang et al. |
| 8,180,994 B2 | 5/2012 | Sprouse et al. |

(Continued)

*Primary Examiner* — Connie C Yoha
(74) *Attorney, Agent, or Firm* — Volentine, Whitt & Francos, PLLC

(57) ABSTRACT

A storage device includes a nonvolatile memory device and a controller configured to send first data, an address, and a first command to the nonvolatile memory device. The controller also sends at least one data to the nonvolatile memory device after sending the first command. The nonvolatile memory device is configured to initiate a program operation, which is based on the first data, in response to the first command. When receiving the at least one data from the controller, the nonvolatile memory device is configured to continue to perform the program operation based on the first data and the at least one data.

20 Claims, 35 Drawing Sheets

(56) References Cited

U.S. PATENT DOCUMENTS

| | | | |
|---|---|---|---|
| 8,411,502 B2 * | 4/2013 | Yoon | G11C 16/3454 365/185.03 |
| 8,514,621 B2 | 8/2013 | Choi et al. | |
| 8,553,446 B2 | 10/2013 | Han et al. | |
| 8,559,235 B2 | 10/2013 | Yoon et al. | |
| 8,654,587 B2 | 2/2014 | Yoon et al. | |
| 8,976,584 B2 | 3/2015 | Han et al. | |
| 9,330,780 B1 * | 5/2016 | Lee | G11C 16/3454 |
| 10,061,633 B2 * | 8/2018 | Yim | G11C 11/5628 |
| 2008/0137426 A1 * | 6/2008 | Dong | G11C 16/0483 365/185.18 |
| 2008/0205161 A1 * | 8/2008 | Kang | G11C 11/5628 365/185.23 |
| 2011/0233648 A1 | 9/2011 | Seol et al. | |
| 2012/0002469 A1 | 1/2012 | Imamoto et al. | |
| 2012/0020155 A1 | 1/2012 | Kim | |
| 2014/0219014 A1 * | 8/2014 | Lee | G11C 11/56 365/163 |
| 2015/0049545 A1 | 2/2015 | Jo et al. | |
| 2016/0071581 A1 * | 3/2016 | Lee | G11C 11/5671 365/185.03 |
| 2017/0154677 A1 * | 6/2017 | Lim | G11C 16/10 |

* cited by examiner

FIG. 33
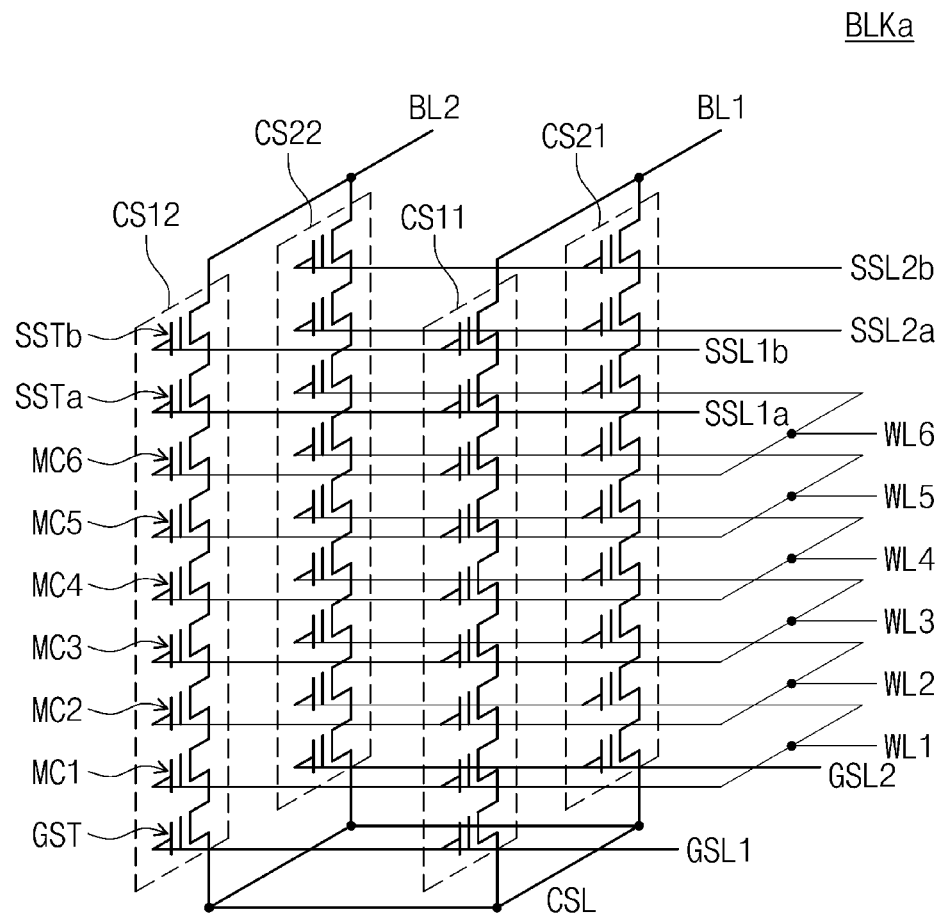
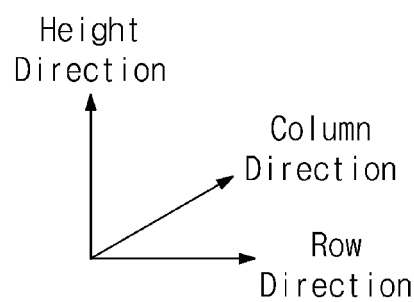

NONVOLATILE MEMORY DEVICE AND STORAGE DEVICE INCLUDING NONVOLATILE MEMORY DEVICE

CROSS-REFERENCE TO RELATED APPLICATIONS

A claim for priority under 35 U.S.C. § 119 is made to Korean Patent Application No. 10-2015-0166119 filed Nov. 26, 2015, and Korean Patent Application No. 10-2016-0024580 filed Feb. 29, 2016, in the Korean Intellectual Property Office, the entire contents of which are hereby incorporated by reference.

BACKGROUND

Field of the Disclosure

The present disclosure relates to a semiconductor memory. More particularly, the present disclosure relates to a nonvolatile memory device and a storage device including the nonvolatile memory device.

Background Information

A storage device refers to a device which stores data, such as a computer, a smart phone, or a smart pad, under control of a host device. The storage device includes a device which stores data on a magnetic disk such as a hard disk drive (HDD), or a device which stores data on a semiconductor memory. A device which stores data on a semiconductor memory may be a nonvolatile memory, such as a solid state drive (SSD) or a memory card.

The nonvolatile memory includes a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), or a ferroelectric RAM (FRAM).

The operating speed of a host device, which communicates with the storage device, such as a computer, a smart phone, or a smart pad is improved as semiconductor manufacturing technologies develop. Furthermore, the size of content used in the storage device and a host device of the host device is increasing. For this reason, the storage device with improved operating speed is being continuously required.

SUMMARY

Embodiments of the present disclosure provide a nonvolatile memory device with improved operating speed and a storage device including the nonvolatile memory device.

One aspect of embodiments of the present disclosure is directed to a storage device. The storage device includes a nonvolatile memory device and a controller configured to send first data, an address, and a first command to the nonvolatile memory device. The controller also sends at least one data to the nonvolatile memory device after sending the first command. The nonvolatile memory device is configured to initiate a program operation, which is based on the first data, in response to the first command. When receiving the at least one data from the controller, the nonvolatile memory device is configured to continue to perform the program operation based on the first data and the at least one data.

Another aspect of embodiments of the present disclosure is directed to a nonvolatile memory device. The nonvolatile memory device includes a memory cell array, a page buffer circuit, and a row decoder. The memory cell array includes multiple memory cells. The page buffer circuit is connected with the multiple memory cells through bit lines and is configured to store data received from an external device. The row decoder is connected with the multiple memory cells through word lines and is configured to perform a program operation with respect to memory cells selected from the multiple memory cells based on the data loaded on the page buffer circuit. The row decoder circuit and the page buffer circuit are configured to initiate a program operation when first data is loaded onto the page buffer circuit. As second data and third data are additionally sequentially loaded onto the page buffer circuit, the program operation is sequentially updated and continuously performed.

Still another aspect of embodiments of the present disclosure is directed to a method of programming data in a nonvolatile memory device. The method includes sending first data to the nonvolatile memory to initiate a program operation, sending second data to the nonvolatile memory device to update the program operation while performing the program operation, and sending third data to the nonvolatile memory device to further update the program operation and continuing to perform the program operation.

BRIEF DESCRIPTION OF THE FIGURES

The above and other objects and features will become apparent from the following description with reference to the following figures, wherein like reference numerals refer to like parts throughout the various figures unless otherwise specified, and wherein

FIG. 33 is a circuit diagram illustrating a memory block according to an embodiment of the present disclosure;

DETAILED DESCRIPTION

Below, embodiments of the present disclosure will be described in detail with reference to the attached drawings to the extent that the scope and spirit of the present disclosure is easily implemented by a person of ordinary skill in the art to which the concepts described herein belong.

Figure 1:
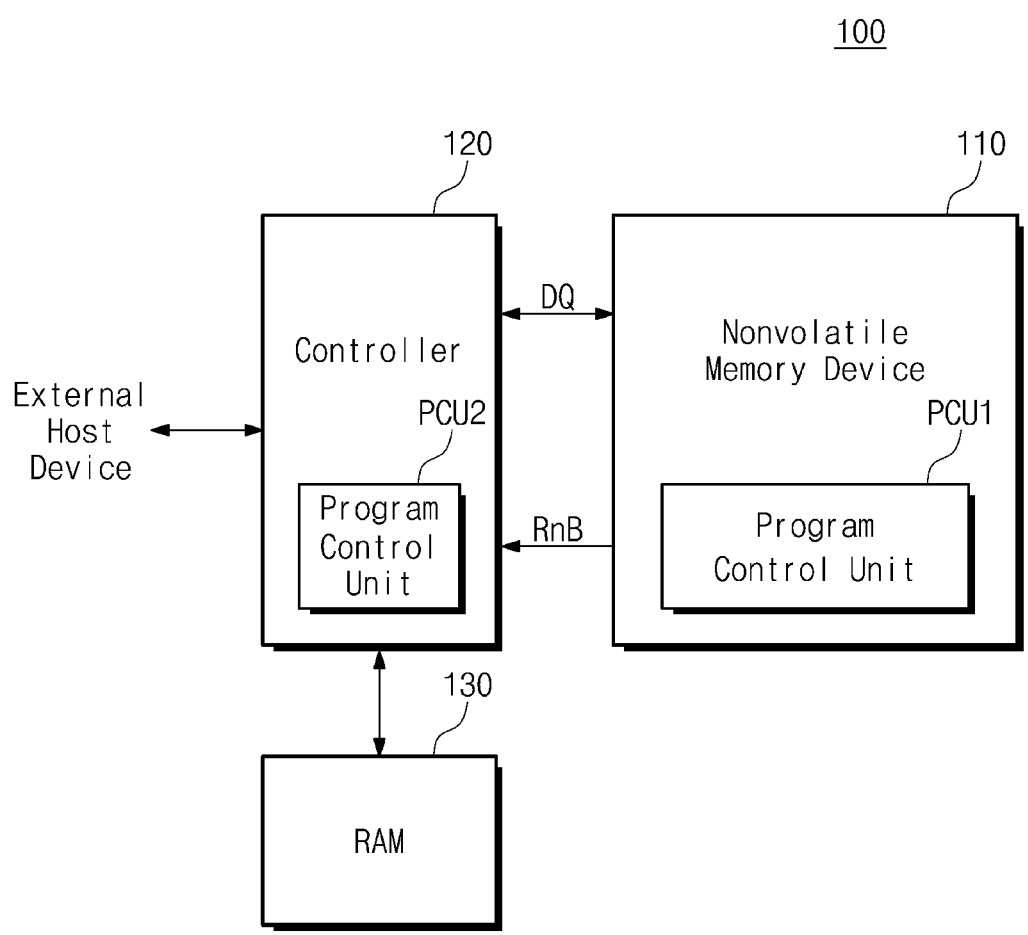
FIG. 1 is a block diagram illustrating a storage device according to an embodiment of the present disclosure.

FIG. 1 is a block diagram illustrating a storage device 100 according to an embodiment of the present disclosure. Referring to FIG. 1, a storage device 100 may include a nonvolatile memory device 110, a controller 120, and a random access memory (RAM) 130.

The nonvolatile memory device 110 may include multiple nonvolatile memory cells. The nonvolatile memory device 110 may be configured to perform a program operation, a read operation, and an erase operation with respect to the nonvolatile memory cells under control of the controller 120. The nonvolatile memory device 110 may receive a command and an address from the controller 120 through an input/output channel and may exchange data with the controller 120. The nonvolatile memory device 110 may provide to the controller 120 a ready/busy signal RnB indicating whether the nonvolatile memory device 110 is able to process a request of the controller 120. For example, when at a ready state in which the nonvolatile memory device 110 is able to process a request of the controller 120, the nonvolatile memory device 110 may set the ready/busy signal RnB to a high level. For example, when at a busy state in which the nonvolatile memory device 110 is performing an internal operation, the nonvolatile memory device 110 may set the ready/busy signal RnB to a low level.

The nonvolatile memory device 110 may include a program control unit PCU1 which is configured to control a program operation in response to a request of the controller 120. The program control unit PCU1 may perform the program operation in response to a request of the controller 120. A program operation which is controlled by the program control unit PCU1 will be described with reference to FIG. 2.

The controller 120 may control the nonvolatile memory device 110 in response to control of an external host device (not illustrated). For example, the controller 120 may control a program operation, a read operation, and an erase operation of the nonvolatile memory device 110. The controller 120 may provide a command and an address to the nonvolatile memory device 110 through input/output lines DQ and may exchange data with the nonvolatile memory device 110 through the input/output lines DQ. The controller 120 may control the nonvolatile memory device 110 based on the ready/busy signal provided from the nonvolatile memory device 110.

The controller 120 may include a program control unit PCU2. The program control unit PCU2 may request a program operation from the nonvolatile memory device 110 and may control the program operation. A program operation which is controlled by the program control unit PCU2 will be described with reference to FIG. 2.

The controller 120 may use the RAM 130 as a working memory, a buffer memory, or a cache memory. For example, the controller 120 may store data received from the external host device in the RAM 130, may provide the data stored in the RAM 130 to the nonvolatile memory device 110, and may request a program operation from the nonvolatile memory device 110. The controller 120 may request a read operation from the nonvolatile memory device 110, may store data received from the nonvolatile memory device 110 in the RAM 130, and may output the data stored in the RAM 130 to the external host device.

Figure 2:
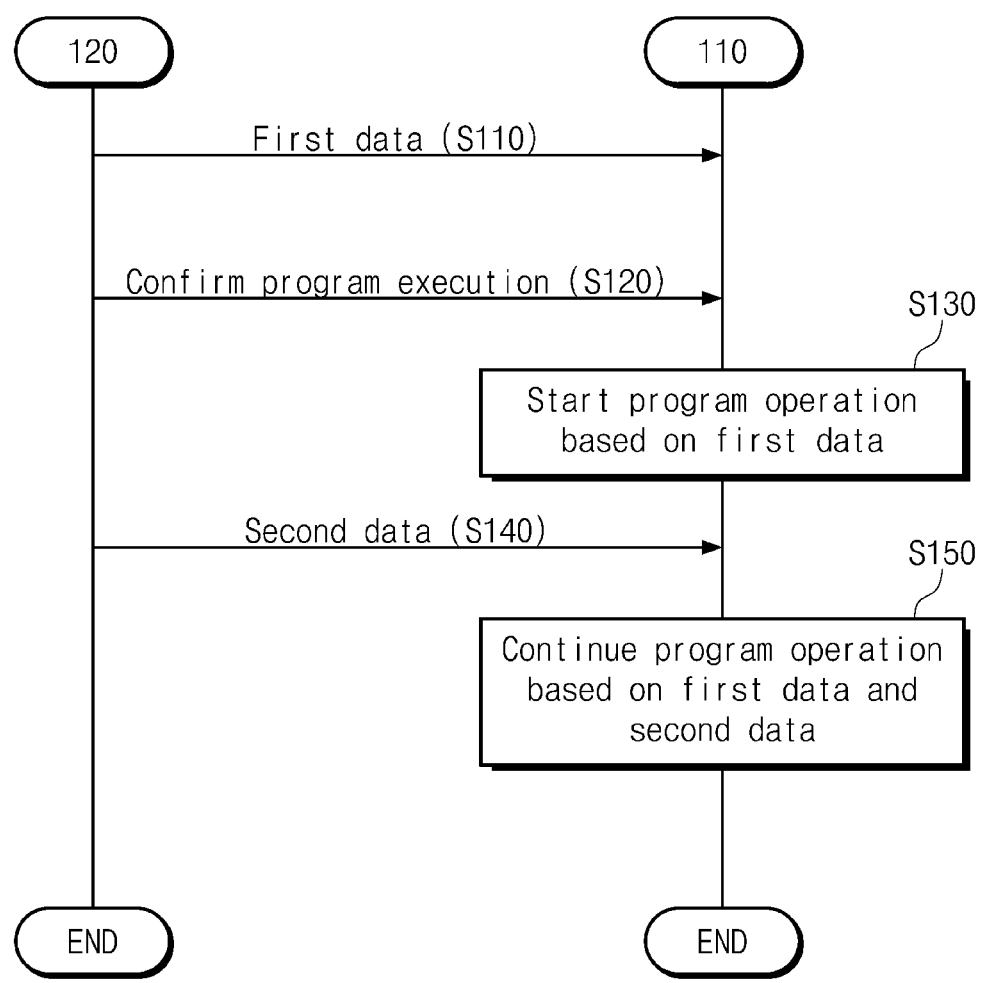
FIG. 2 is a flowchart illustrating a program operation performed by a program control unit of a nonvolatile memory device and a program control unit of a controller.

FIG. 2 is a flowchart illustrating a program operation performed by a program control unit PCU11 of a nonvolatile memory device 110 and a program control unit PCU2 of a controller 120. Referring to FIGS. 1 and 2, in step S110, the controller 120 may provide first data to the nonvolatile memory device 110. For example, the first data may be a portion of data to be programmed at memory cells through a program operation. For example, the first data may include data corresponding to at least one logical page among logical pages belonging to one physical page.

After the controller 120 provides the first data to the nonvolatile memory device 110, in step S120, the program control unit PCU2 of the controller 120 may confirm program execution. Before all the data to be programmed through a program operation is transmitted, the program control unit PCU2 may request the nonvolatile memory device 110 to initiate the program operation.

As the program execution is confirmed, in step S130, the program control unit PCU1 of the nonvolatile memory device 110 may initiate the program operation based on the first data. After the program operation starts, the program control unit PCU1 of the nonvolatile memory device 110 may switch a state of the ready/busy signal from a busy state to a ready state to notify the controller 120 that reception of additional data is possible.

In step S140, the program control unit PCU2 of the controller 120 may provide second data to the nonvolatile memory device 110 while the program operation is performed on the nonvolatile memory device 110. For example, the second data may be the rest of the data to be programmed at memory cells through a program operation. For example, the second data may include data corresponding to at least one logical page among logical pages belonging to one physical page.

As the second data is received, in step S150, the nonvolatile memory device 110 may continue to perform the program operation based on the first data and the second data. For example, the nonvolatile memory device 110 may continue to perform the program operation, which is initiated in step S130, based on the first data and the second data.

According to embodiments of the present disclosure, the program operation may start after a portion of data (e.g., the first data) to be programmed through the program operation is sent to the nonvolatile memory device 110. The rest of the data (e.g., the second data) to be programmed may be provided to the nonvolatile memory device 110 while the program operation is performed. Accordingly, a time when the second data is provided to the nonvolatile memory device 110 may be shadowed by fully or partially simultaneous operations, thereby reducing a time taken to perform a program operation of the storage device 100.

In an embodiment, step S110 and step S150 may be continuously and/or simultaneously performed for a period of time. The controller 120 may provide the first data (step S110) and may provide the second data (S140) when a program operation starts (S120 and S130). Even though the nonvolatile memory device 110 sets the ready/busy signal RnB to a ready state after the first data is provided thereto and the program operation starts, the controller 120 may not allow other access operations except providing the second data. For example, there may be prohibited access operations which the controller 120 requests to the nonvolatile memory device 110 between providing the first data (step S110) and providing the second data (step S140). Prohibited access operations may include another program operation, a read operation, or an erase operation. There may also be allowed control operations such as an operation in which the controller 120 resets the nonvolatile memory device 110, an operation in which the controller 120 requests the nonvolatile memory device 110 to stop operating, and an operation in which the controller 120 requests status read for verifying a status of the nonvolatile memory device 110.

Figure 3:
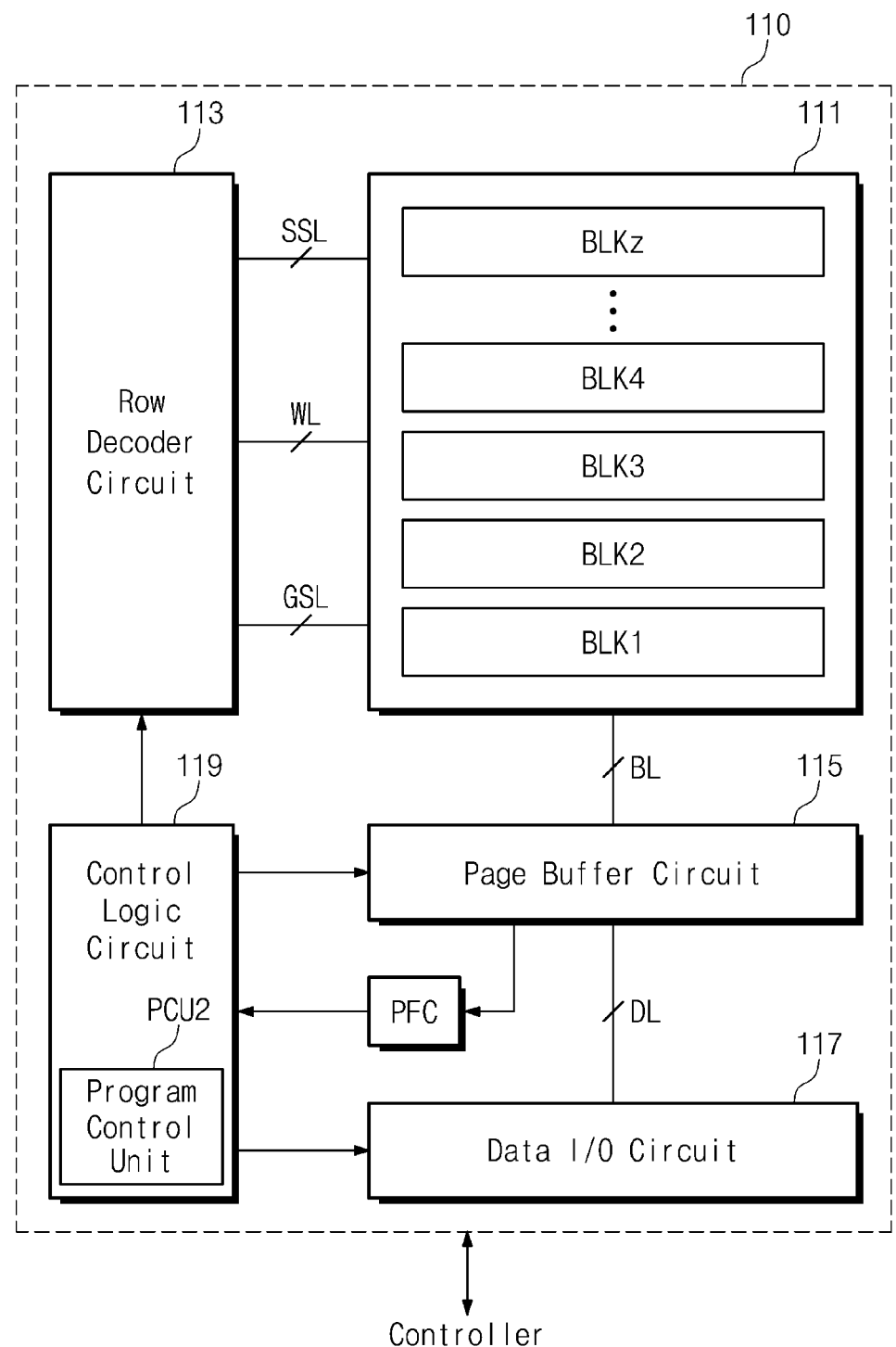
FIG. 3 is a block diagram illustrating a nonvolatile memory device according to an embodiment of the present disclosure.

FIG. 3 is a block diagram illustrating a nonvolatile memory 110 according to an embodiment of the present disclosure. Referring to FIG. 1, the nonvolatile memory device 110 may include a memory cell array 111, a row decoder circuit 113, a page buffer circuit 115, a pass-fail check circuit PFC, a data input/output circuit 117, and a control logic circuit 119.

The memory cell array 111 may include multiple memory cells BLK1 to BLKz. Each of the memory blocks BLK1 to BLKz may include multiple memory cells. Each of the memory blocks BLK1 to BLKz may be connected to the row decoder circuit 113 through at least one string selection line SSL, multiple word lines WL, and at least one string selection line SSL. Each of the memory blocks BLK1 to BLKz may be connected to the page buffer circuit 115 through multiple bit lines BL. The memory blocks BLK1 to BLKz may be connected in common to the multiple bit lines BL. Memory cells in the memory blocks BLK1 to BLKz may have the same structures.

In an embodiment, each of the memory blocks BLK1 to BLKz may be a unit for an erase operation. An erase operation of memory cells in the memory cell array 111 may be carried out by the memory block. The memory cells belonging to a memory block may be erased at the same time. In another embodiment, each memory block may be divided into multiple sub-blocks. Each of the sub-blocks may be an erase unit.

In an embodiment, each of the memory blocks BLK1 to BLKz may include a physical storage space which is distinguished by a block address. Each of the word lines WL may correspond to a physical storage space which is distinguished by a row address. Each of the bit lines BL may correspond to a physical storage space which is distinguished by a column address.

In an embodiment, each memory block may include multiple physical pages, each of which includes multiple memory cells. A physical page may refer to a program unit. Memory cells of a physical page may be simultaneously programmed. A physical page may include two or more logical pages. Bits to be programmed at memory cells of a physical page may constitute logical pages. First bits to be programmed at memory cells of a physical page may constitute a first logical page. K-th bits (K being a positive integer) to be programmed at the memory cells of the physical page may constitute a k-th logical page.

The row decoder circuit 113 may be connected to the memory cell array 111 through multiple ground selection lines GSL, the multiple word lines WL, and multiple string selection lines SSL. The row decoder circuit 113 may operate according to control of the control logic circuit 119. The row decoder circuit 113 may decode an address received from the controller 120 through an input/output channel and may allow voltages to be applied to the string selection lines SSL, the word lines WL, and the ground selection lines GSL based on the decoded address.

For example, during a program operation, the row decoder circuit 113 may apply a program voltage (e.g., VPGM) to a selected word line in a memory block selected by an address, and may apply a pass voltage (e.g., VPASS) to unselected word lines in the selected memory block. During a read operation, the row decoder circuit 113 may apply a selection read voltage (e.g., VRD) to the selected word line and a non-selection read voltage (e.g., VREAD) to the unselected word lines in the selected memory block. During an erase operation, the row decoder circuit 113 may apply an erase voltage (e.g., a ground voltage or similar low voltage) to word lines in a memory block selected by an address.

The page buffer circuit 115 may be connected to the memory cell array 111 through the bit lines BL. The page buffer circuit 115 may be connected to the data input output circuit 117 through multiple data lines DL. The page buffer circuit 115 may operate under control of the control logic circuit 119.

During a program operation, the page buffer circuit 115 may store data to be programmed in memory cells. The page buffer circuit 115 may apply voltages to the bit lines BL based on the stored data. For example, the page buffer circuit 115 may function as a write driver. During a read operation or a verification read, the page buffer circuit 115 may sense voltages on the bit lines BL and may store the sensed results therein. For example, the page buffer circuit 115 may function as a sense amplifier.

During a verification, the pass-fail check circuit PFC may receive the sensed result from the page buffer circuit 115. The pass-fail check circuit PFC may determine a pass or fail based on the received sensed results. For example, during a program verification, the page buffer circuit 115 may count the number of on-cells turned on. When the number of on-cells is greater than or equal to a threshold value, the PFC may determine that the verification fails. When the number of on-cells is smaller than the threshold value, the PFC may determine that the verification passes. For example, during an erase verification, the page buffer circuit 115 may count the number of off-cells. When the number of off-cells is greater than or equal to a threshold value, the PFC may determine verification fail. When the number of on-cells is smaller than the threshold value, the PFC may determine that the verification passes. The pass or fail determination result may be provided to the control logic circuit 119.

The data input/output circuit 117 may be connected to the page buffer circuit 115 through the data lines DL. The data input/output circuit 117 may output data, which is read by the page buffer circuit 115, to the controller 120 through the input/output channel. The data input/output circuit 117 may provide data, which is received from the controller 120 through the input/output channel, to the page buffer circuit 115.

The control logic circuit 119 may receive a command from the controller 120 through the input/output channel and may receive a control signal therefrom through a control channel. The input/output channel may include input/output lines DQ, and the control channel may include a line through which the ready/busy signal RnB is transmitted. The control logic circuit 119 may receive a command, which is provided through the input/output channel, in response to the control signal. The control logic circuit 119 may route an address, which is provided through the input/output channel, to the row decoder circuit 113. The control logic circuit may also route data, which is provided through the input/output channel, to the data input/output circuit 117. The control logic circuit 119 may decode the received command and may control the nonvolatile memory device 110 based on the decoded command.

In an embodiment, the control logic circuit 119 may generate a data strobe signal DQS based on a read enable signal/RE received from the controller 120 through the input/output channel. The data strobe signal DQS thus generated may be outputted to the controller 120 through the control channel. During a program operation, the control logic circuit 119 may receive the data strobe signal DQS from the controller 120 through the control channel.

Under control of the control logic circuit 119, a program operation, an erase operation, and a read operation may be performed with respect to memory cells of each memory block. The program operation may include multiple program loops. A program loop may be repeated until the program operation is determined as passing a verification.

Each program loop may include a program and a verification. In the program, the page buffer circuit 115 may apply voltages to bit lines BL based on data to be programmed. For example, a ground voltage or similar low voltage may be applied to a bit line corresponding to a memory cell of which the threshold voltage is to be increased. A power supply voltage or similar positive voltage may be applied to a memory cell (e.g., a memory cell to be program inhibited) of which the threshold voltage does not need to increase. The row decoder circuit 113 may apply a program voltage to a word line connected to selected memory cells and may apply a pass voltage to the remaining word lines. In the verification, a result of the program operation performed in the program may be verified. The verification may include a verification read and a pass-fail determination. During the verification read, the page buffer circuit 115 may apply a power supply voltage or similar positive voltage to the bit lines BL or bit lines corresponding to memory cells to be verified. The row decoder circuit 113 may apply a verification voltage to a word line connected to the memory cells to be verified and may apply read pass voltages to the remaining word lines, respectively. The result of the verification read may be sensed by the page buffer circuit 115, and the sensed result may be provided to the PFC. During the pass-fail determination, the pass-fail check circuit PFC may determine whether the memory cells pass or fail based on the result of the verification read.

In an embodiment, during a program operation of the nonvolatile memory device 110, the nonvolatile memory device 110 may continuously receive all bits to be programmed at memory cells of a selected physical page of the memory cell array 111. The nonvolatile memory device may complete programming of the selected physical page through a program operation based on the continuously received bits. Completion of the programming may mean that all bits to be programmed at a corresponding physical page are programmed to have a readable state and additional programming of the corresponding physical page is prohibited.

A read operation may be similar to a verification read. During the read operation, the page buffer circuit 115 may apply a power supply voltage or similar positive voltage to the bit lines BL or bit lines corresponding to memory cells to be verified. The row decoder circuit 113 may apply a read voltage to a word line connected to memory cells to be read and may apply read pass voltages to the remaining word lines. The result of the read operation may be sensed by the page buffer circuit 115 and may be outputted through the data input/output circuit 117.

An erase operation may include multiple erase loops. The erase loop may be repeated until the erase operation passes. Each erase loop may include an erase and a verification. During the erase, the row decoder circuit 113 may apply a ground voltage or similar low voltage to word lines connected to selected memory cells. An erase voltage may be applied to channels of the selected memory cells through a substrate. During the verification, the result of the erase operation performed in the erase result may be verified. The verification may include a verification read and a pass-fail determination. During the verification read, the page buffer circuit 115 may apply a power supply voltage or similar positive voltage to the bit lines BL or bit lines corresponding to memory cells to be verified. The row decoder circuit 113 may apply an erase verification voltage to word lines connected to memory cells to be verified. The result of the verification read may be sensed by the page buffer circuit 115, and the sensed result may be provided to the PFC.

During the pass-fail determination, pass-fail check circuit PFC may determine whether the memory cells pass or fail based on the result of the verification read.

The program control unit PCU2 may control the row decoder circuit 113, the page buffer circuit 115, and the data input/output circuit 117 such that a program operation is performed according to a method described with reference to FIG. 2.

Figure 4:
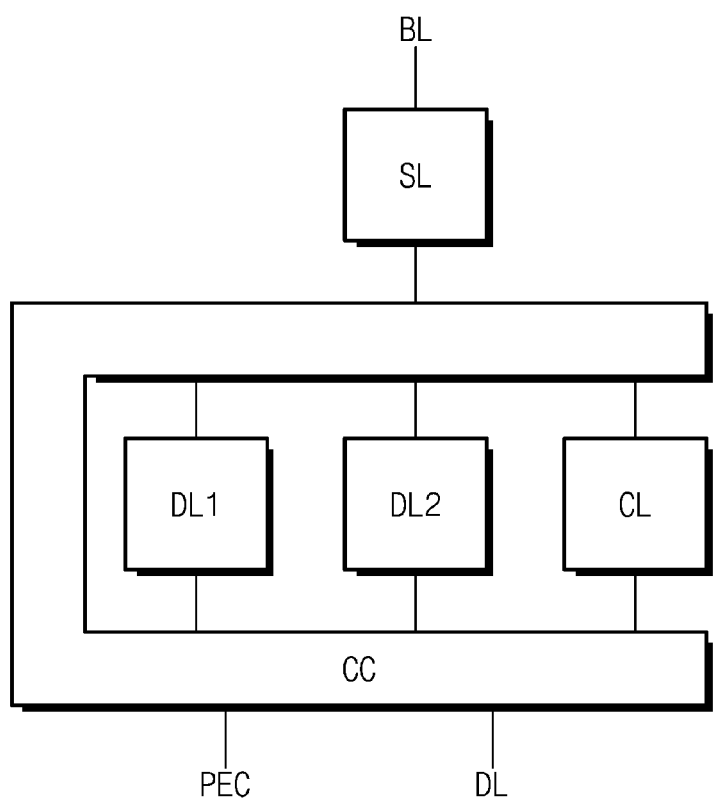
FIG. 4 is a block diagram illustrating a page buffer circuit according to an embodiment of the present disclosure.

FIG. 4 is a block diagram illustrating a page buffer circuit 115 according to an embodiment of the present disclosure. In an embodiment, elements corresponding to a bit line BL are illustrated in FIG. 4. Referring to FIGS. 3 and 4, the page buffer circuit 115 may include a control circuit CC, a cache latch CL, data latches DL1 and DL2, and a sense latch SL.

The control circuit CC may be connected to a data line DL and a bit line BL. The control circuit CC may load data, which is transmitted through the data line DL, on the cache latch CL. The control circuit CC may dump the data loaded on the cache latch CL onto one of the data latches DL1 and DL2 in response to control of the control logic circuit 119. The control circuit CC may set the sense latch SL based on data loaded on the data latches DL1 and DL2 or data loaded on the data latches DL1 and DL2 and the cache latch CL. The bit line BL may be set up according to a value set to the sense latch SL.

The sense latch SL may be set according to a voltage of the bit line BL. The control circuit CC may set the data latches DL1 and DL2 or the latches DL1, DL2, and CL based on a value set to the sense latch SL. The control circuit CC may output data, which is set to the data latches DL1 and DL2 or is set to the data latches DL1 and DL2 and the cache latch CL, to the data line DL or the pass-fail check circuit PFC.

In an embodiment, the number of data latches DL1 and DL2 or the number of latches DL1, DL2, and CL may be determined according to the number of bits to be programmed at each memory cell of each memory block. That is, the number of data latches DL1 and DL2 or the number of latches DL1, DL2, and CL may be determined according to the number of logical pages belonging to one physical page.

Figure 5:
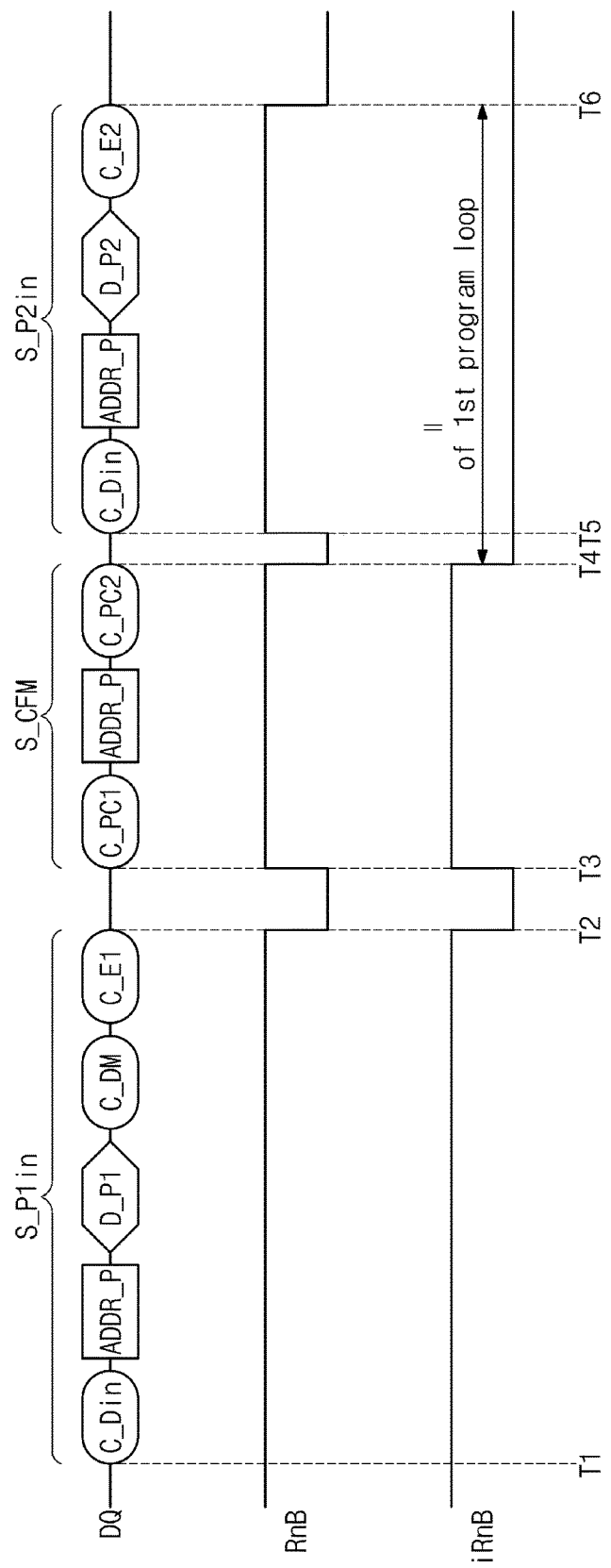
FIGS. 5 and 6 are timing diagrams illustrating a program operation according to an embodiment of the present disclosure, when viewed from input/output lines and a ready/busy signal.
Figure 6:
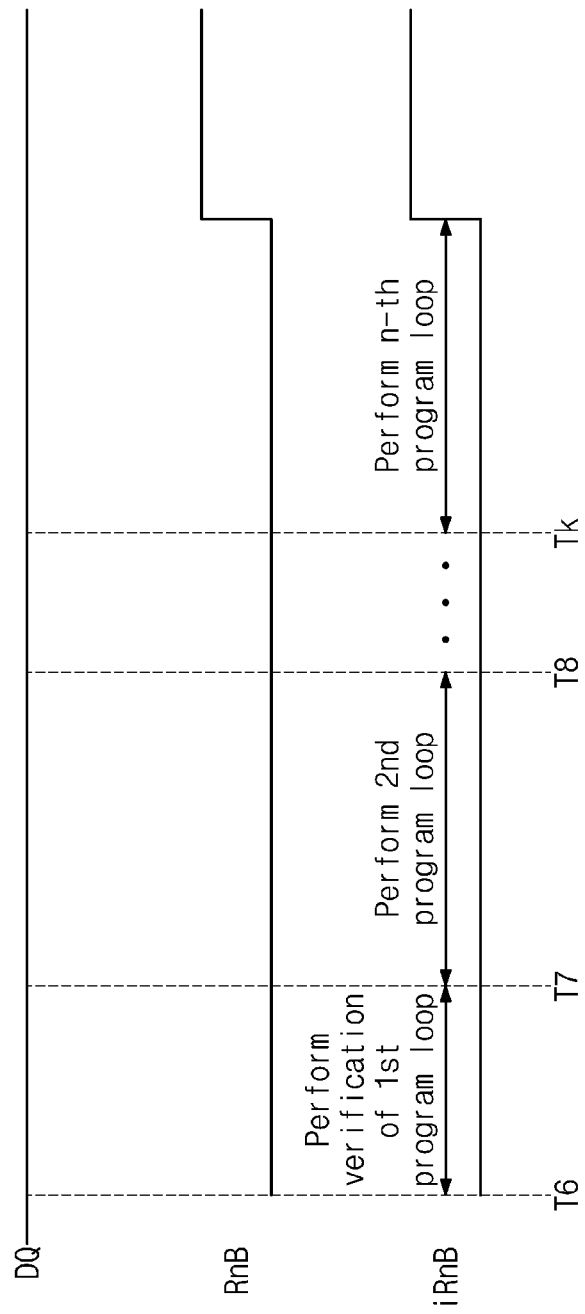

FIGS. 5 and 6 are timing diagrams illustrating a program operation according to an embodiment of the present disclosure, when viewed from input/output lines DQ and a ready/busy signal RnB. Referring to FIGS. 1, 3, 4, and 5, at T1, the controller 120 may transmit a first sequence S_P1in through the input/output lines DQ. For example, the controller 120 may transmit a data input command C_Din, an address ADDR_P, first data D_P1, a dump command C_DM, and an end command C_E1. The data input command C_Din may be "80h" indicating that data to be programmed is received. The address ADDR_P may indicate memory cells at which data is to be programmed, for example, an address of a physical page. The first data D_P1 may be data of one among logical pages belonging to a physical page corresponding to the address ADDR_P. The dump command C_DM may be a command for requesting the dump of data and may be "C0h". The end command C_E1 may be "11h" indicating that data of a first logical page is completely transmitted.

While the first input sequence S_P1in progresses, the nonvolatile memory device 110 may maintain the ready/busy signal RnB at a ready state of a high level. An internal ready/busy signal iRnB may indicate whether an operation is performed in the nonvolatile memory device, independently of the ready/busy signal RnB that the nonvolatile memory device 110 outputs to the controller 120. While the first input sequence S_P1in progresses, the internal ready/busy signal iRnB may be maintained at a ready state of a high level.

In the first input sequence S_P1in, the first data D_P1 provided from the controller 120 to the nonvolatile memory device 110 through the input/output lines DQ may be stored in the cache latches CL. When receiving the dump command C_DM and the end command C_E1 through the input/output lines DQ, the nonvolatile memory device 110 may dump the first data D_P1 loaded on the cache latches CL onto the first data latches DL1 or the second data latches DL2. As the nonvolatile memory device 110 dumps the first data D_P1, a state of the internal ready/busy signal iRnB of the nonvolatile memory device 110 may be changed from the ready state of the high level to a busy state of a low level at T2. A state of the ready/busy signal RnB may be changed from the ready state of the high level to the busy state of the low level. When the first data D_P1 is completely dumped, at T3, a state of each of the internal ready/busy signal iRnB and the ready/busy signal RnB may be changed from the busy state of the low level to the ready state of the high level.

The controller 120 may perform a confirm sequence S_CFM as the ready/busy signal RnB transitions to the ready state of the high level at T3. For example, the controller 120 may sequentially provide a first confirm command C_PC1, an address ADDR_P, and a second confirm command C_PC2 through the input/output lines DQ. The first confirm command C_PC1 may indicate a start of the confirm sequence S_CFM and may be "88h". The address ADDR_P may indicate memory cells at which a program operation is to be performed, for example, an address of a physical page. The second confirm command C_PC2 may indicate an end of the confirm sequence S_CFM and may be "15h".

As the confirm sequence S_CFM is received through the input/output lines DQ, at T4, the nonvolatile memory device 110 may initiate programming of a first program loop. The internal ready/busy signal iRnB of the nonvolatile memory device 110 may transition to the busy state of the low level. When the programming of the first program loop starts, the nonvolatile memory device 110 may make the ready/busy signal RnB transition to the busy state of the low level. When the control circuit CC and the cache latch CL are ready to receive data during the program of the first program loop, at T5, the nonvolatile memory device 110 may make the ready/busy signal RnB transition to the ready state of the high level.

The controller 120 may perform a second data input sequence S_P2in as the ready/busy signal RnB transitions to the ready state of the high level at T5. For example, the controller 120 may sequentially provide a data input command C_Din, an address ADDR_P, second data D_P2, and an end command C_E2 to the nonvolatile memory device 110. As in the first data input sequence S_P1in, the controller 120 may provide the second data D_P2 to the nonvolatile memory device 110 in the second data input sequence S_P2in. The second data D_P2 may be data of a second logical page to be programmed at memory cells corresponding to the address ADDR_P. Furthermore, the controller 120 may provide the end command C_E2 to the nonvolatile memory device 110 without providing the dump command C_DM to the nonvolatile memory device 110. The end command C_E2 may be "12h" indicating that data of a second logical page is completely transmitted.

Referring to FIGS. 1 and 3 to 6, when the end command C_E2 is received through the input/output lines DQ, at T6, all data to be programmed at memory cells corresponding to the address ADDR_P may be loaded on the page buffer circuit 115. Accordingly, the nonvolatile memory device 110 may continuously perform the program operation by making the ready/busy signal RnB transition to the busy state of the low level. For example, the nonvolatile memory device 110 may perform a verification of the first program loop. For example, after receiving all data to be programmed, the nonvolatile memory device 110 may perform a verification read and a pass-fail check.

As the program operation is continuously performed, between T7 and T8, the nonvolatile memory device 110 may perform a second program loop based on the first data D_P1 and the second D_P2. At Tk, the program operation may end as the nonvolatile memory device 110 performs an n-th program loop. When the program operation ends, each of the internal ready/busy signal iRnB and the ready/busy signal RnB of the nonvolatile memory device 110 may transition to the ready state of the high level.

In an embodiment, the second data D_P2 may be able to be required in performing the verification of the first program loop. According to embodiments of the present disclosure, the program operation of the first program loop may be performed in parallel with an operation of transmitting the second data D_P2. The verification operation of the first program loop may be performed after the second data D_P2 is provided to the nonvolatile memory device 110. This will be more fully described with reference to FIGS. 8 to 9.

Figure 7:
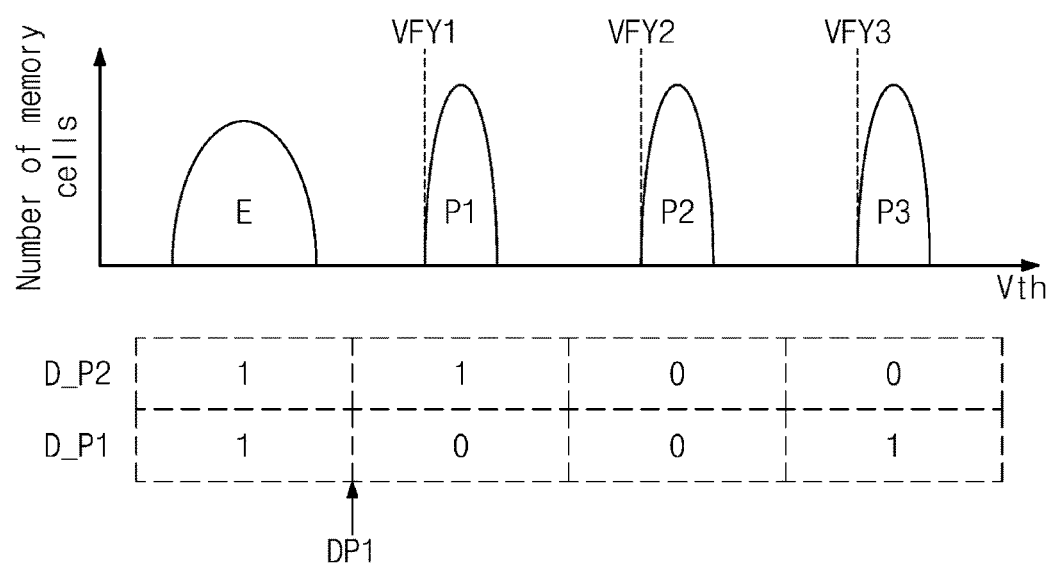
FIG. 7 illustrates an example in which threshold voltages of memory cells are distributed according to data programmed at the memory cells.

FIG. 7 illustrates an example in which threshold voltages of memory cells are distributed according to data programmed at the memory cells. In FIG. 7, the abscissa represents a threshold voltage. The ordinate represents the number of memory cells. That is, threshold voltage distributions of memory cells programmed are illustrated in FIG. 7.

Referring to FIG. 7, when a bit of the first data D_P1 is "1" and a bit of the second data D_P2 is "1", a memory cell may maintain an erase state even though a program operation is performed. When a bit of the first data D_P1 is "0" and a bit of the second data D_P2 is "1", a memory cell may have a first program state P1 after a program operation is performed. The first program state P1 may be verified using a first verification voltage VFY1. When a bit of the first data D_P1 is "0" and a bit of the second data D_P2 is "0", a memory cell may have a second program state P2 after a program operation is performed. The second program state P2 may be verified using a second verification voltage VFY2. When a bit of the first data D_P1 is "1" and a bit of the second data D_P2 is "0", a memory cell may have a third program state P3 after a program operation is performed. The third program state P3 may be verified using a third verification voltage VFY3.

According to an embodiment of the present disclosure, when a transmission time of the second data D_P2 is shadowed by fully or partially simultaneous operations, the program operation of the first program loop may be performed in parallel with an operation of transmitting the second data D_P2. The verification operation of the first program loop may be performed after the second data D_P2 is provided to the nonvolatile memory device 110. That the verification operation of the first program loop is performed after the second data D_P2 is transmitted will be more fully described with reference to FIGS. 8 and 9.

According to an embodiment of the present disclosure, the controller 120 may be configured to select data in order to shadow a transmission time of the second data D_P2 by fully or partially simultaneous operations. The data is selected as the first data D_P1 to be provided for the first time and has a determination point DP1 between a state (e.g., the erase state E) corresponding to the lowest threshold voltage range and a state (e.g., the first program state P1) corresponding to a threshold voltage range following the lowest threshold voltage range. The determination point DP1 may indicate a point where values of bits the most adjacent are different from each other. For example, in the first data D_P1, the erase state E may correspond to "1", and the first program state P1 may correspond to "0". Accordingly, the first data D_P1 may be selected as data to be provided for the first time. The determination point DP1 will be more fully described with reference to FIGS. 10 to 16.

Figure 8:
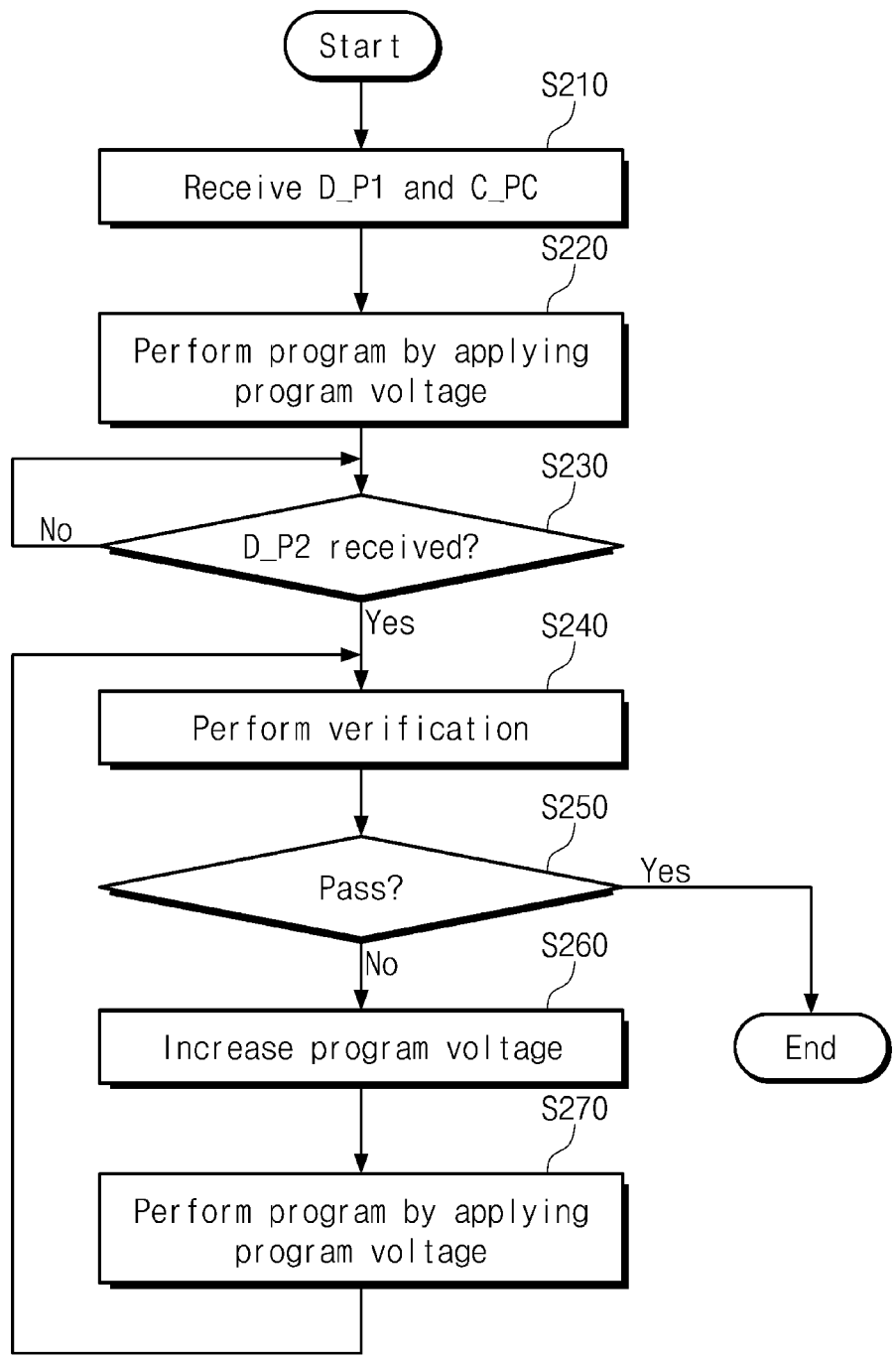
FIG. 8 is a flowchart illustrating the procedure for performing a program method, according to an embodiment of the present disclosure.

FIG. 8 is a flowchart illustrating the procedure for performing a program method, according to an embodiment of the present disclosure. Referring to FIGS. 1, 3, and 8, in step S210, the nonvolatile memory device 110 may receive the first data D_P1 and the confirm command C_PC.

In step S220, the nonvolatile memory device 110 may perform a program and a verification of a program operation by applying a program voltage to a word line connected to selected memory cells. In step S230, the nonvolatile memory device 110 may stop the program operation and may wait until the second data D_P2 is received.

If the second data D_P2 is received, in step S240, the nonvolatile memory device 110 may perform verification. If the result of the verification is pass, the program operation may end. If the result of the verification is fail, the procedure proceeds to step S260, in which the program voltage increase. In step S270, the program may be performed by applying the program voltage to the selected word line. Afterwards, the procedure proceeds to step S240 to perform the verification again.

Figure 9:
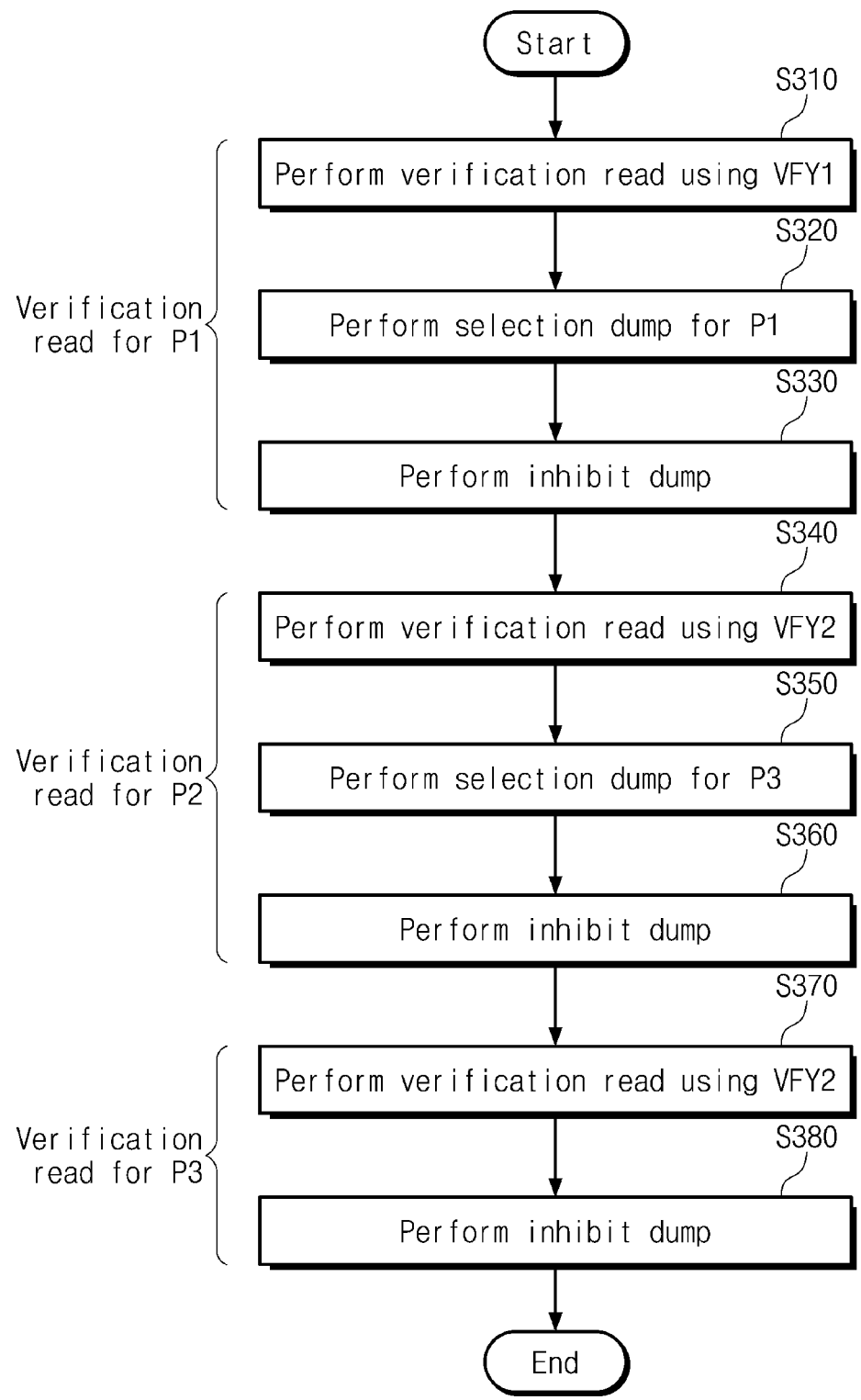
FIG. 9 is a flowchart illustrating a method in which verification read is performed upon verification.

FIG. 9 is a flowchart illustrating a method in which verification read is performed upon verification. Referring to FIGS. 1, 3, 4, and 9, in steps S310 to S330, a verification read may be performed with respect to the first program state P1. In step S310, the nonvolatile memory device 110 may perform a verification read by applying a first verification voltage VFY1 to a word line connected to selected memory cells. The verification read result may be stored in the sense latches SL. In step S320, a selection dump may be performed with respect to the first program state P1. For example, the control circuit CC may initialize the verification read result stored in the sense latch SL connected to a corresponding bit line where data stored in data latches DL1 and DL2 or data stored in the data latches DL1 and DL2 and the cache latch CL connected to the corresponding bit line indicates the second program state P2 or the third program state P3. For example, the control circuit CC may initialize the sense latch SL such that the verification read result stored therein indicates fail. In step S330, an inhibit dump may be performed. For example, the control circuit CC may store information indicating that the memory cells pass verification into the data latches DL1 and DL2 associated with sense latches, each of which stores a value corresponding to passing verification from among sense latches SL, or in the data latches DL1 and DL2 and the cache latch CL associated therewith.

In steps S340 to S360, a verification read may be performed with respect to the second program state P2. In step S340, the nonvolatile memory device 110 may perform a verification read by applying a second verification voltage VFY2 to the word line connected to the selected memory cells. The verification read result may be stored in the sense latches SL. In step S350, a selection dump associated with the second program state P2 may be performed. For example, the control circuit CC may initialize the verification read result stored in the sense latch SL connected to a corresponding bit line where data stored in data latches DL1 and DL2 or data stored in the data latches DL1 and DL2 and the cache latch CL connected to the corresponding bit line indicates to the third program state P3. For example, the control circuit CC may initialize the sense latch SL such that the verification read result indicates fail. In step S360, an inhibit dump may be performed. For example, the control circuit CC may store information indicating that the memory cells pass verification into the data latches DL1 and DL2 associated with sense latches, each of which stores a value corresponding to passing verification, from among sense latches SL or in the data latches DL1 and DL2 and the cache latch CL associated therewith.

In steps S370 to S380, a verification read may be performed with respect to the third program state P3. In step S370, the nonvolatile memory device 110 may perform a verification read by applying a third verification voltage VFY3 to the word line connected to the selected memory cells. The verification read result may be stored in the sense latches SL. In step S380, an inhibit dump may be performed. For example, the control circuit CC may store information indicating that the memory cells pass verification into the data latches DL1 and DL2 associated with sense latches, each of which stores a value corresponding to passing verification, from among the sense latches SL or in the data latches DL1 and DL2 and the cache latch CL associated therewith.

As described above, information indicating the second program state P2 and the third program state P3 is required for performing the selection dump. Corresponding information may be obtained since both the first data D_P1 and the second data D_P2 exist. Accordingly, the nonvolatile memory device 110 according to an embodiment of the present disclosure may perform a program of a first program loop and may hold a verification of the first program loop until the second data D_P2 is received.

An embodiment of the present disclosure is exemplified in FIG. 9 as verification reads are sequentially performed with respect to the first to third states P1 to P3. However, when a verification that at least one of the first to third program states P1 to P3 has passed, a verification read associated with the at least one program state thus passed may be skipped.

As illustrated in FIG. 9, the selection dump of the first program state P1 (step S320) may be performed after a verification read (step S310) using the first verification voltage VFY1 is performed. Accordingly, the scope and spirit of the concepts described herein may be applied to the case that a verification read using the first verification voltage VFY1 of the verification of the first program loop is performed in parallel with transmission of the second data D_P2, in addition to the case that a program of the first program loop is performed in parallel with transmission of the second data D_P2.

Figure 10:
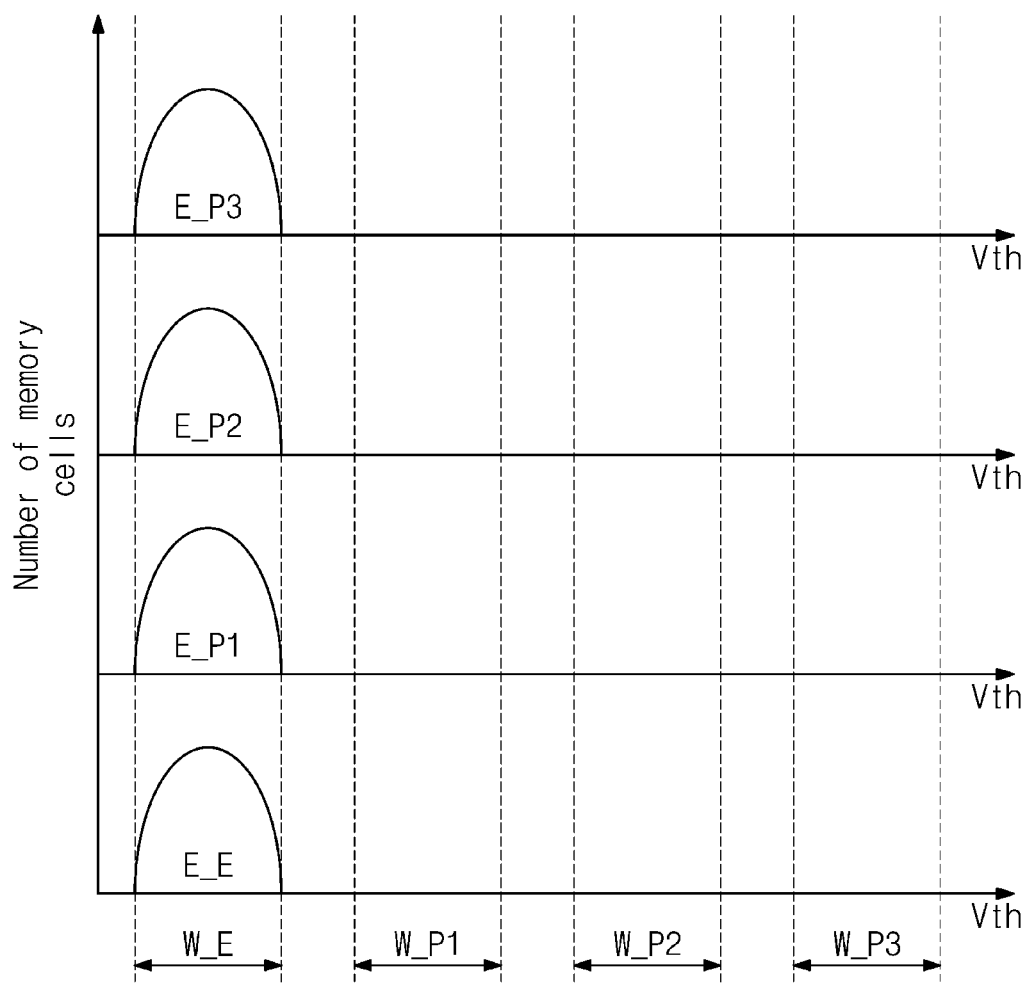
FIG. 10 illustrates threshold voltage distributions of memory cells of an erase state.

FIG. 10 illustrates threshold voltage distributions of memory cells of an erase state. In FIG. 10, the abscissa represents threshold voltages of memory cells MC. The ordinate represents the number of memory cells MC.

Referring to FIGS. 7 and 10, a reference symbol "E_E" may indicate memory cells the erase state E of each of which is maintained during a program operation. A reference symbol "E_P1" may indicate memory cells which are programmed to the first program state P1 from the erase state E. A reference symbol "E_P2" may indicate memory cells which are programmed to the second program state P2 from the erase state E. A reference symbol "E_P3" may indicate memory cells which are programmed to the third program state P3 from the erase state E.

A reference symbol "W_E" may indicate a range of threshold voltages respectively corresponding to memory cells of the erase state E. A reference symbol "W_P1" may indicate a range of threshold voltages respectively corresponding to memory cells of the first program state P1. A reference symbol "W_P2" may indicate a range of threshold voltages respectively corresponding to memory cells of the second program state P2. A reference symbol "W_P3" may indicate a range of threshold voltages respectively corresponding to memory cells of the third program state P3.

Before the program operation is performed, memory cells E_E, E_P1, E_P2, and E_P3 may belong to a threshold voltage range W_E of the erase state E.

Figure 11:
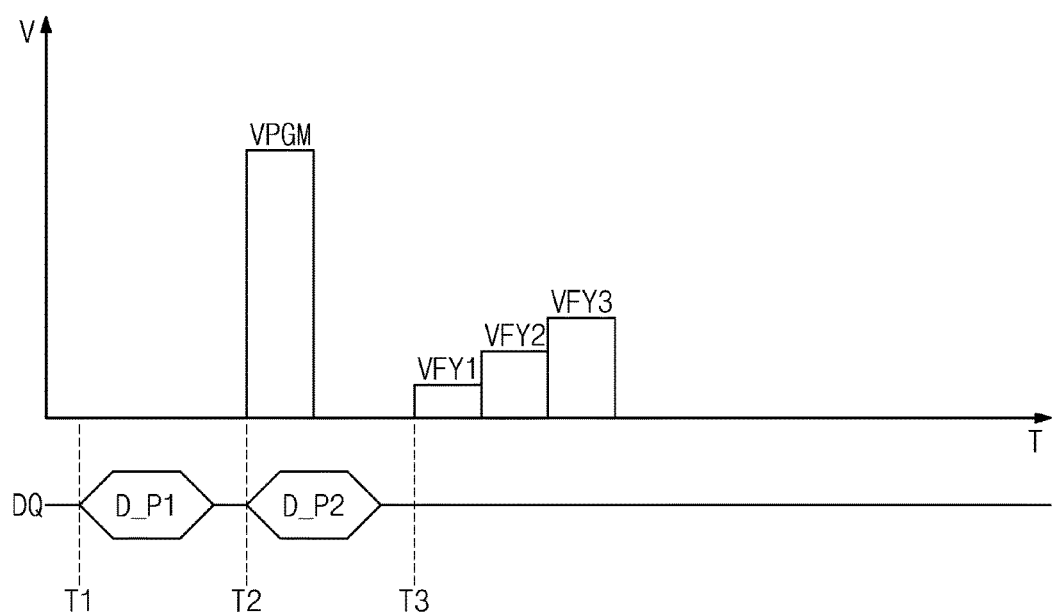
FIG. 11 shows a timeline for voltage and data for a process in which a first program loop is performed at memory cells of FIG. 10.

FIG. 11 shows a timeline for voltage and data for a process in which a first program loop is performed at memory cells of FIG. 10. In FIG. 11, the abscissa represents a time T. The ordinate represents data transmitted through input/output lines DQ and a voltage V applied to a word line connected to selected memory cells.

Referring to FIGS. 3, 7, 10, and 11, at T1, first data D_P1 may be provided to the page buffer circuit 115 through the input/output lines DQ. When the first data D_P1 is completely received, the page buffer circuit 115 may set up bit lines BL based on the first data D_P1. For example, bit lines corresponding to memory cells E_E and E_P3 to be programmed (or maintained) to the erase state E and the third program state P3 may be set to be program-inhibited. Bit lines corresponding to memory cells E_E and E_P2 to be programmed to the first program state P1 and the second program state P2 may be set to be programmed. Afterwards, at T2, the row decoder circuit 113 may apply a program voltage VPGM to a selected word line. During program in which the program voltage VPGM is applied to the selected word line, second data D_P2 may be provided to the page buffer circuit 115 through the input/output lines DQ.

When the second data D_P2 is completely received, at T3, the page buffer circuit 115 may precharge the bit lines BL. For example, before a verification read using a first verification voltage VFY1, the page buffer circuit 115 may charge bit lines, which correspond respectively to memory cells E_P1 to be programmed to the first program state P1, with a power supply voltage or similar positive voltage, respectively. The page buffer circuit 115 may charge the remaining bit lines with a ground voltage or similar low voltage, or may float the remaining bit lines. Afterwards, the row decoder circuit 113 may apply a first verification voltage VFY1 to the selected word line.

After the page buffer circuit 115 charges bit lines corresponding to memory cells E_P2 to be programmed to the second program state P2, the row decoder circuit 113 may apply the second verification voltage VFY2 to the selected word line. Furthermore, after the page buffer circuit 115 charges bit lines corresponding to memory cells E_P3 to be programmed to the third program state P3, the row decoder circuit 113 may apply the third verification voltage VFY3 to the selected word line.

As another example, the page buffer circuit 115 may be configured to charge all bit lines with the power supply voltage or similar positive voltage, regardless of the program states P1 to P3 before one of the verification voltages VFY1 to VFY3 is applied to the selected word line.

Figure 12:
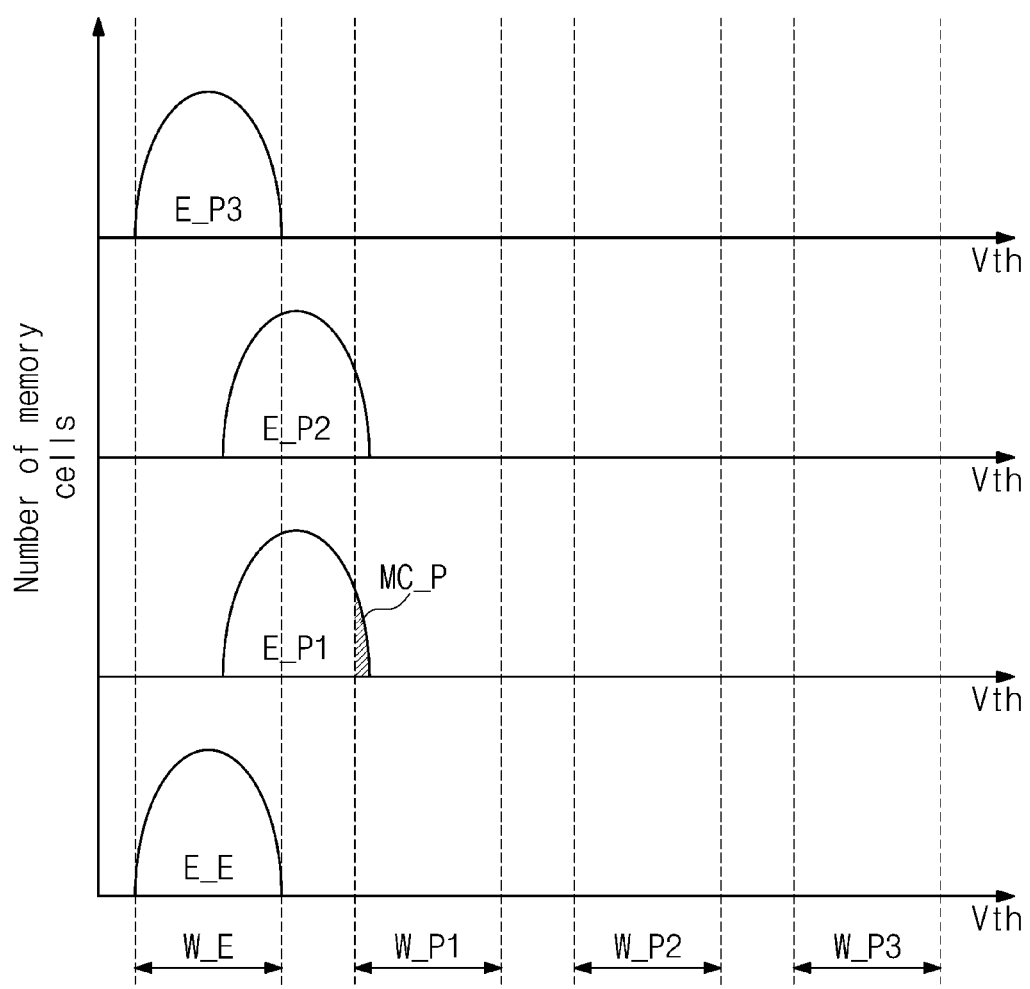
FIG. 12 shows an example of threshold voltages of memory cells changed from FIG. 10.

As the first program loop illustrated in FIG. 11 progresses, threshold voltages of memory cells illustrated in FIG. 10 may be changed as illustrated in FIG. 12. Referring to FIG. 12, threshold voltages of memory cells E_P1 and E_P2 to be programmed to the first and second program states P1 and P2 may increase. Memory cells E_P3 to be programmed to the third program state P3 may be program-inhibited according to the first data D_P1 in a first program loop, and thus threshold voltages of the memory cells E_P3 may not increase.

Figure 13:
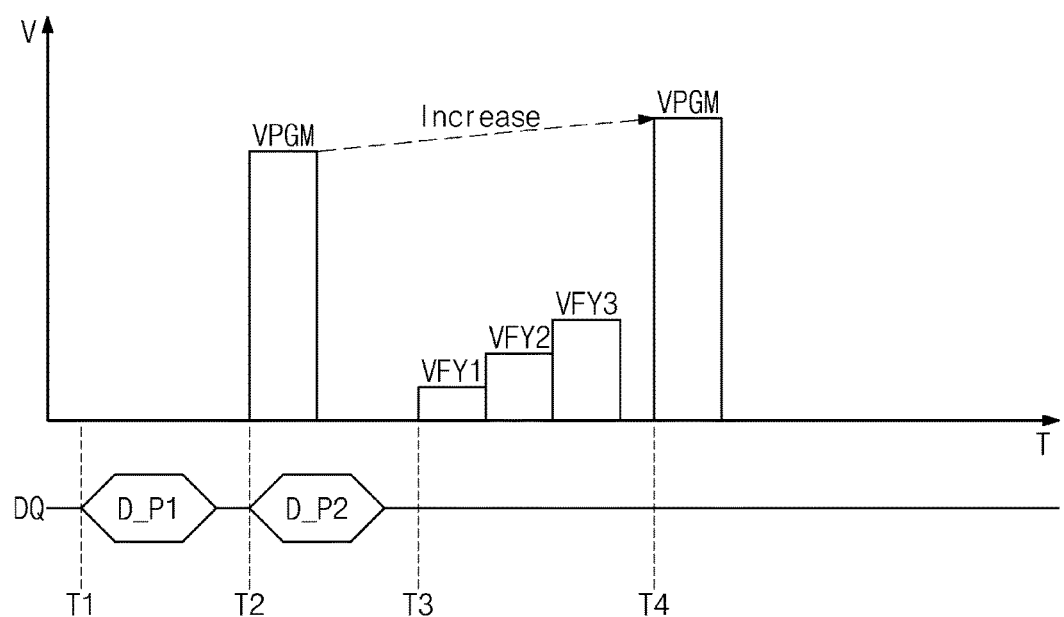
FIG. 13 shows a timeline for voltage and data for a process in which a second program loop is performed following FIG. 11.

FIG. 13 shows a timeline for voltage and data for a process in which a second program loop is performed following FIG. 11. Referring to FIGS. 12 and 13, threshold voltages of a part MC_P among memory cells E_P1 to be programmed to the first program state P1 may be higher than the first verification voltage VFY1, and threshold voltages of the remaining memory cells may be lower than or equal to the first verification voltage VFY1. Accordingly, the memory cells MC_P among the memory cells E_P1 may be set to "program inhibit", and the rest may be set to "program". Memory cells E_P2 and E_P3 to be programmed to the second and third program states P2 and P3 all may be at a fail state. Accordingly, the memory cells E_P2 and E_P3 may be set to "program". Afterwards, an increased program voltage VPGM may be applied to a selected word line at T4.

Figure 14:
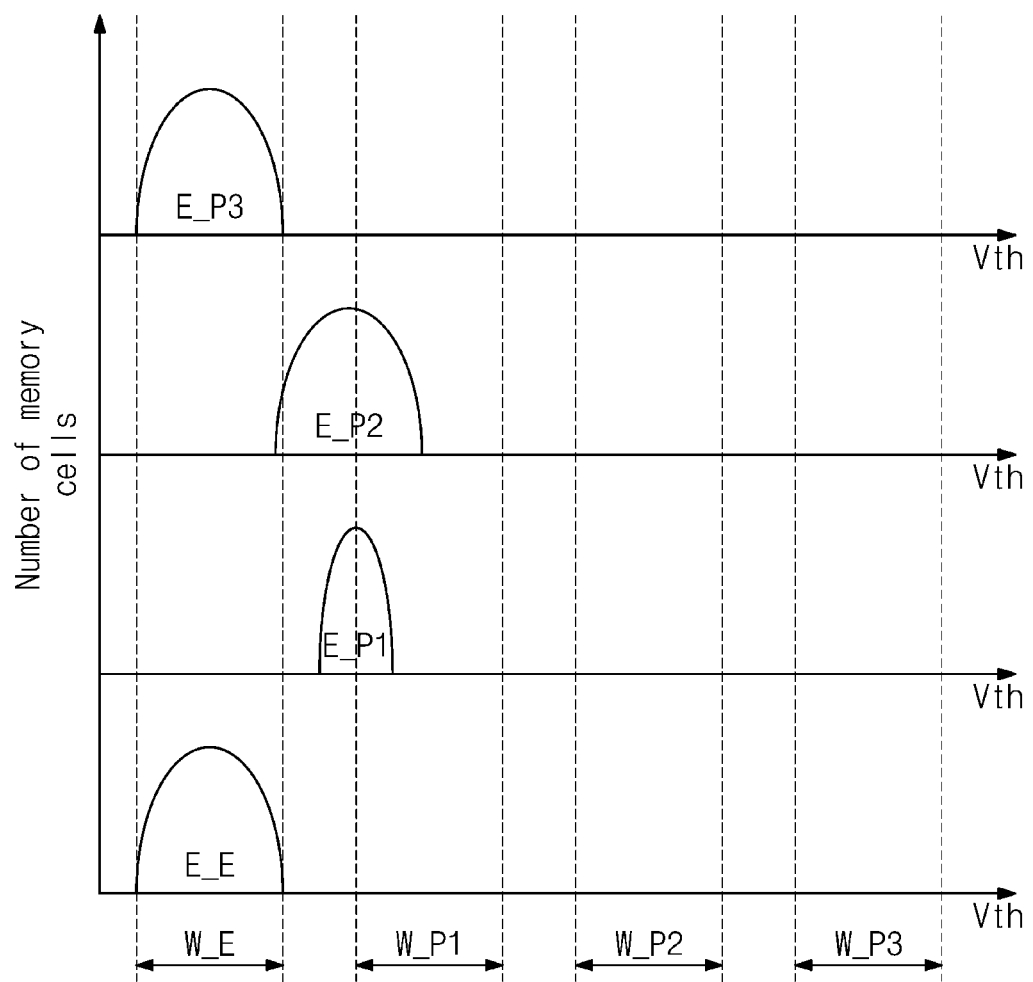
FIG. 14 shows an example of threshold voltages of memory cells changed from FIG. 12.

As the increased program voltage VPGM is applied to the selected word line, threshold voltages of memory cells illustrated in FIG. 12 may be changed as illustrated in FIG. 14. Referring to FIG. 14, threshold voltages of memory cells E_P2 and E_P3 to be programmed to the second and third program states P2 and P3 may increase. Since threshold voltages of a part MC_P among memory cells E_P1 to be programmed to the first program state P1 do not increase, a distribution width may be reduced even though threshold voltages of the memory cells E_P1 increase.

Figure 15:
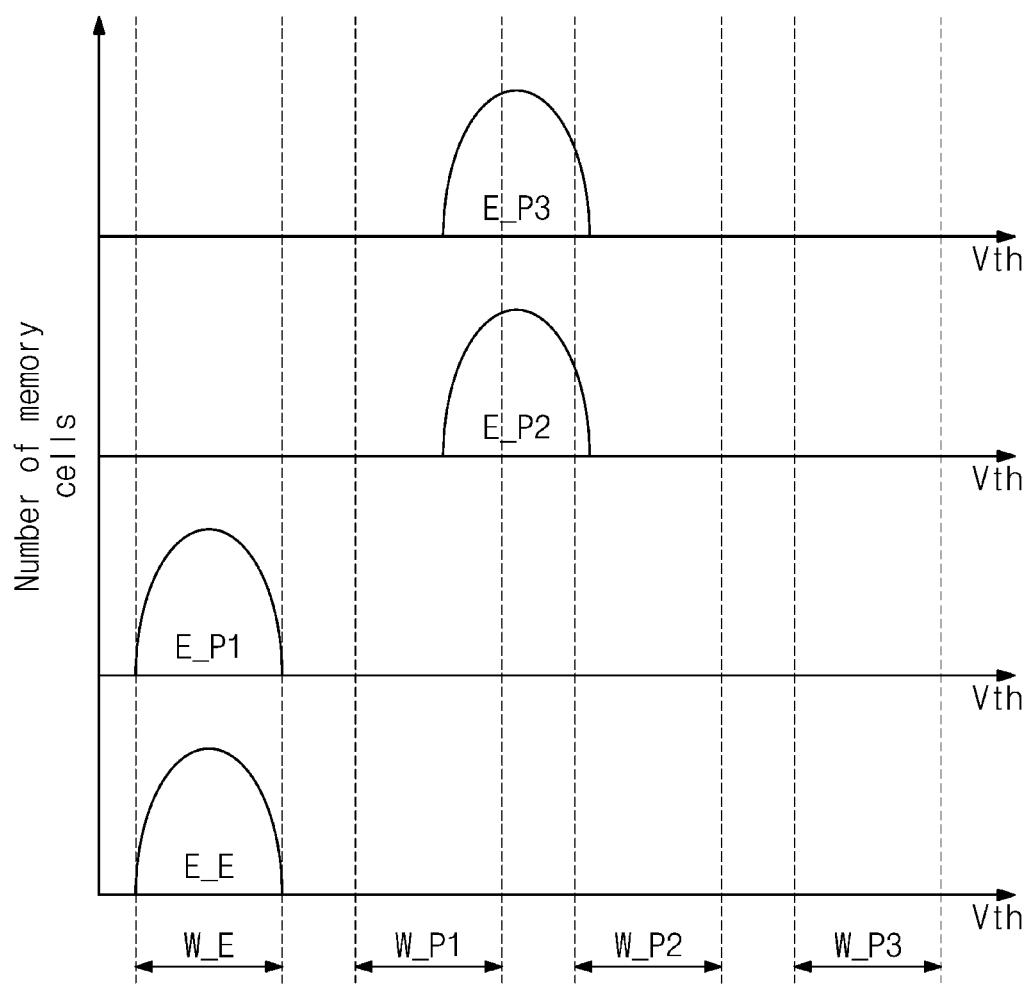
FIG. 15 shows threshold voltages of memory cells when second data is transmitted and a program of a first program loop is then performed.

FIG. 15 shows threshold voltages of memory cells when second data D_P2 is transmitted and a program of a first program loop is then performed. As illustrated in FIG. 7, in the second data D_P2, each of the erase state E and the first program state P1 may correspond to "1", and each of the second and third program states P2 and P3 may correspond to "0". Accordingly, when the first program loop is performed based on the second data D_P2, memory cells E_P2 and E_P3 to be programmed to the second and third program states E_P2 and E_P3 may be programmed, and memory cells E_P1 to be programmed to the first program state P1 may be program-inhibited. Accordingly, as illustrated in FIG. 15, threshold voltages of the memory cells E_P3 and E_P2 may increase, while threshold voltages of the memory cells E_P1 may not increase.

Figure 16:
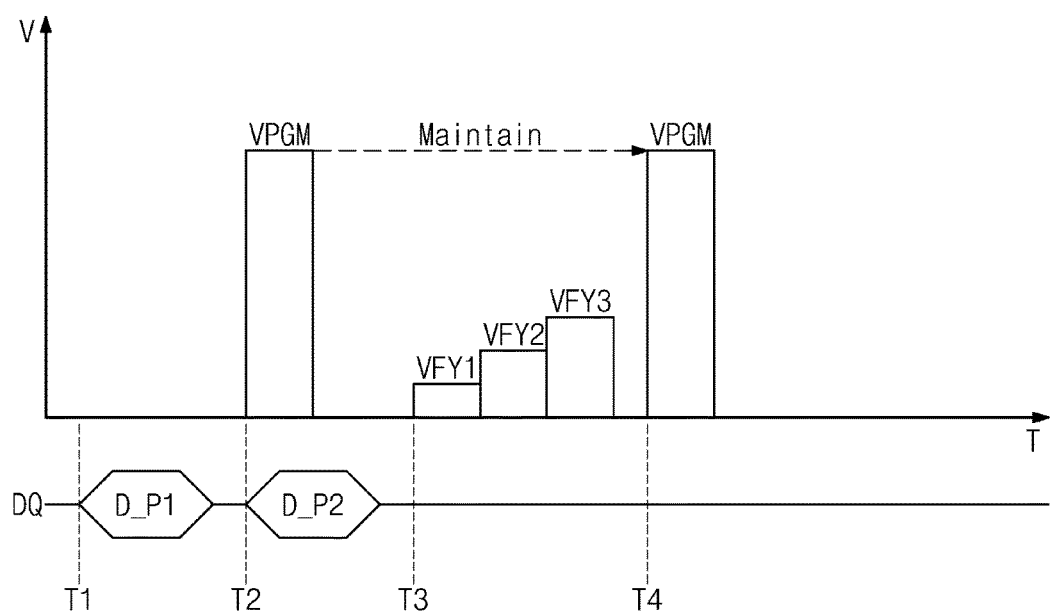
FIG. 16 shows a timeline for voltage and data for a process in which program loops of a program operation of FIG. 26 are performed.

In an embodiments of FIG. 12, when an increased program voltage is applied to a selected word line in a second program loop in a case that the first program state P1 and the second program state P2 cannot distinguished and the memory cells MC_P cannot be program-inhibited, the memory cells MC_P illustrated in FIG. 12 may be programmed with the increased program voltage. In this case, the memory cells MC_P may be over-programmed. To prevent the memory cells MC_P from being over-programmed, as illustrated in FIG. 16, the program voltage VPGM of the second program loop may not increase. That is, if the second data D_P2 is provided to the nonvolatile memory device 110 prior to the first data D_P1 and a program operation is performed, a program loop may be performed twice using the same program voltage VPGM. Accordingly, a program time may not decrease but increase.

According to an embodiment of the present disclosure, the controller 120 may be configured to provide the nonvolatile memory device 110 with data of a logical page in which a bit value of a state corresponding to the lowest threshold voltage range and a bit value of a state corresponding to a threshold voltage range following the lowest threshold voltage range are different from each other. For example, the state corresponding to the lowest threshold voltage range may be the erase state E, and the state corresponding to the threshold voltage range following the lowest threshold voltage range may be the first program state P1. Accordingly, memory cells E_P1 to be programmed to the lowest program state P1 are programmed and verified in the first program loop, and an execution time of a program loop may be shadowed by a transmission time of the second data D_P2.

As another example, to improve the reliability of memory cells, as illustrated in FIG. 15, the second data D_P2 may be loaded prior to the first data D_P1, and a program operation may start. The second data D_P2 may be loaded on the page buffer circuit 115 while a program of a first program loop of the program operation is performed based on the first data D_P1. In this case, after threshold voltages of memory cells E_P2 to be programmed to the second program state P2 and threshold voltages of memory cells E_P3 to be programmed to the third program state P3 increase as illustrated in FIG. 15, a program loop may be again performed using the same program voltage VPGM. For example, a program operation may start after pre-program for increasing threshold voltages of memory cells E_P2 and E_P3 as illustrated in FIG. 15.

In this case, the coupling or other disturbances which the memory cells E_P1 experience when threshold voltages of the memory cells E_P2 and E_P3 increase as illustrated in FIG. 15 may be canceled while the memory cells E_P1 are programmed to the first program state P1. That is, the first data D_P1 may be loaded, and after a program operation starts, the second data D_P2 may be loaded, thereby reducing the coupling or other disturbances occurring during the program operation. This may mean that the integrity of data programmed at memory cells is improved.

Figure 17:
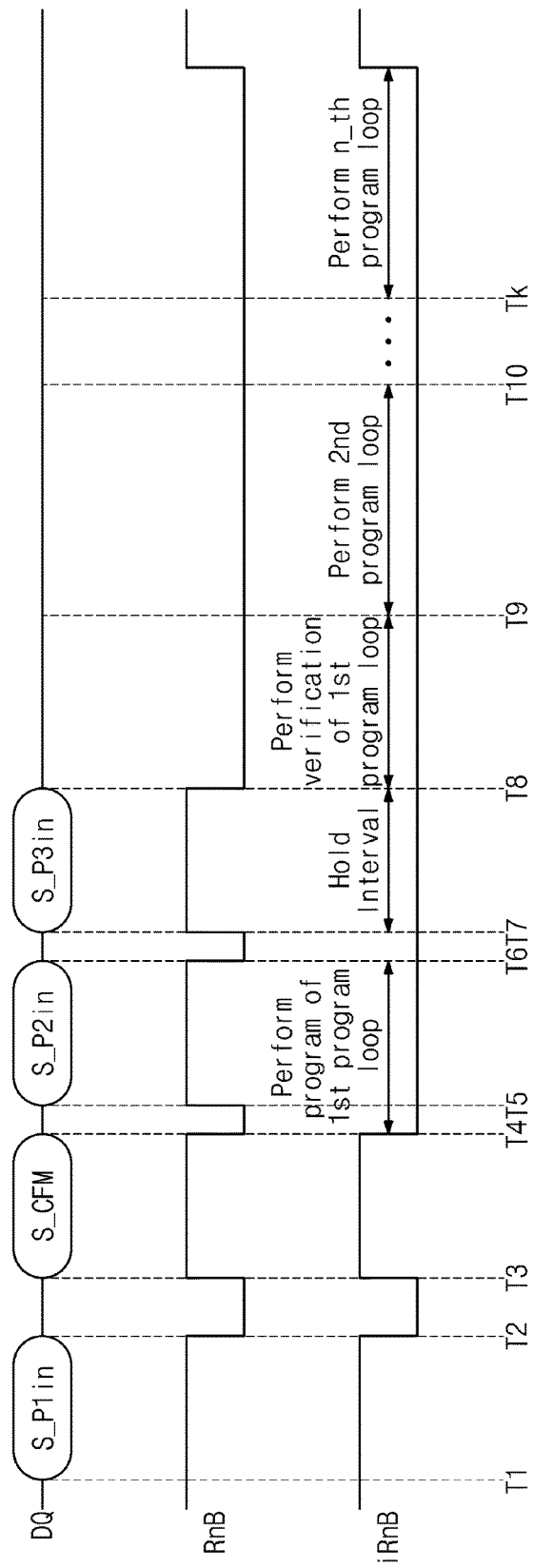
FIG. 17 shows a process in which a program operation according to an embodiment of the present disclosure is performed when a physical page includes three logical pages.

FIG. 17 shows a process in which a program operation according to an embodiment of the present disclosure is performed when a physical page includes three logical pages. In FIG. 17, the abscissa may indicate a time. Referring to FIGS. 1, 3, and 17, at T1, the controller 120 may provide a first data input sequence S_P1in to the nonvolatile memory device 110 through the input/output lines DQ. The first data input sequence S_P1in may include data of a first logical page. The first logical page may have a determination point DP1 between the erase state E and the lowest program state P1.

At T2, the nonvolatile memory device 110 may perform dumping based on the first data input sequence S_P1in. During the dumping of the nonvolatile memory device 110, the internal ready/busy signal iRnB and the ready/busy signal RnB may transition to the busy state of the low level. When the dumping is completed, at T3, the nonvolatile memory device 110 may make the ready/busy signal RnB transition to the ready state of the high level. The internal ready/busy signal iRnB may also transition to the ready state of the high level.

As the ready/busy signal RnB transitions to the ready state of the high level, the controller 120 may provide the confirm sequence S_CFM to the nonvolatile memory device 110 through the input/output lines DQ. At T4, the nonvolatile memory device 110 may initiate a program operation, and the internal ready/busy signal iRnB and the ready/busy signal RnB may transition to the busy state of the low level. The internal ready/busy signal iRnB may be maintained at a low level until the program operation is completed. The ready/busy signal RnB may transition to the ready state of the high level when the nonvolatile memory device 110 is ready to receive data.

As the ready/busy signal RnB transitions to the high level, at T5, the controller 120 may provide a second data input sequence S_P2in to the nonvolatile memory device 110 through the input/output lines DQ. The second data input sequence S_P2in may include data of a second logical page. While the second data input sequence S_P2in progresses, the nonvolatile memory device 110 may perform a program of the first program loop.

When the second data input sequence S_P2in is completed, the nonvolatile memory device 110 may dump the second data D_P2. While the nonvolatile memory device 110 dumps the second data D_P2, the ready/busy signal RnB may transition to the low level. When the dumping is completed, the nonvolatile memory device 110 may make the ready/busy signal RnB transition to the high level.

As the ready/busy signal RnB transitions to the high level, at T7, the controller 120 may provide a third data input sequence S_P3in to the nonvolatile memory device 110 through the input/output lines DQ. The third data input sequence S_P3in may include data of a third logical page.

In an embodiment, the nonvolatile memory device 110 may have a hold interval in which a program operation is held, until a program of a first program loop is performed and data of all logical pages is received.

When the third data input sequence S_P3in is completed, at T8, the nonvolatile memory device 110 may perform a verification of the first program loop. Afterwards, the nonvolatile memory device 110 may perform a second program loop between T9 and T10. At Tk, the nonvolatile memory device 110 may perform an n-th program loop and may end the program operation.

In an embodiment, the hold interval may occur in the case where two bits are programmed at a memory cell and in the case where loading of second data is not completed even after a program of the first program loop is completed. For example, until loading of second data is completed after a program of a first program loop is completed, the nonvolatile memory device 110 may have a hold interval in which another operation is not performed while waiting for the loading of the second data.

The scope and spirit of the concepts described herein may not be limited to the case that one physical page includes two or three logical pages. For example, the scope and spirit of the concepts described herein may be expanded to include the case that m logical pages (m being a positive integer) are included in one physical page. For example, the scope and spirit of the concepts described herein may be expanded to include the case that m bits are programmed at one physical page. A program operation may start after data of at least one page is provided to the nonvolatile memory device 110. For example, a program of a first program loop may be performed at the nonvolatile memory device 110. A program operation may continue after data of the remaining logical pages is provided to the nonvolatile memory device 110. For example, a verification of the first program loop and the remaining program loops following the first program loop may be performed.

In the above-described embodiments, an embodiment of the present disclosure is exemplified as two bits being programmed at each memory cell. However, the scope and spirit of the memory cells described herein may not be limited thereto.

Figure 18:
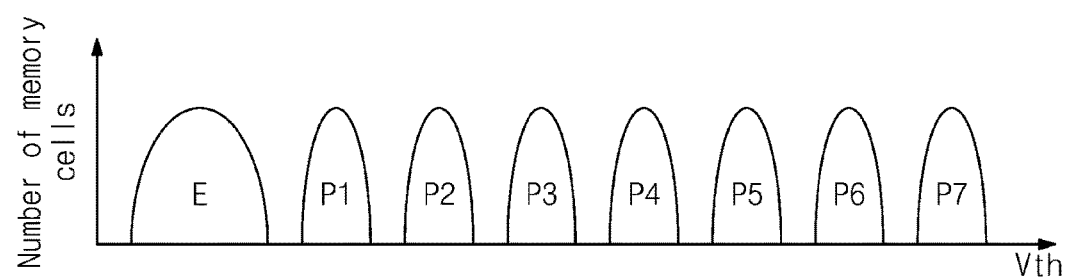
FIG. 18 is a diagram illustrating threshold voltages of memory cells when three bits are programmed at each memory cell.
Figure 19:
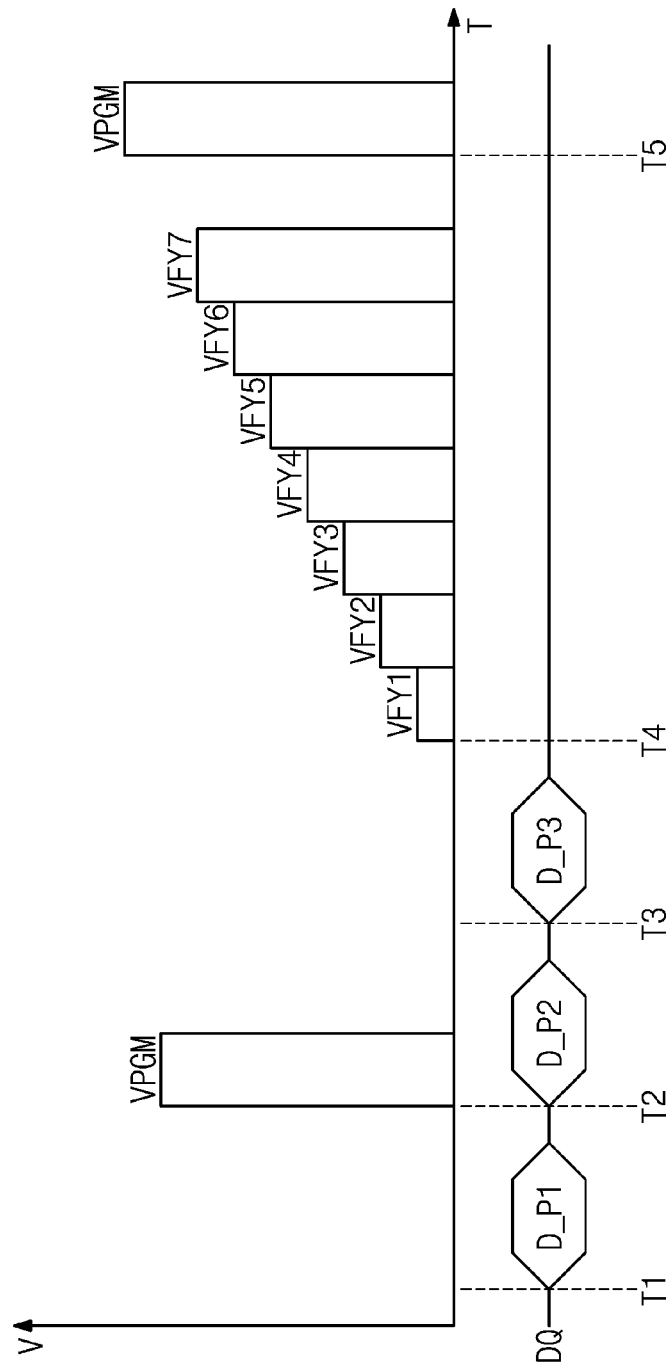
FIG. 19 shows a timeline for voltage and data for a process in which a first program loop is performed when three bits are programmed at each memory cell.

FIG. 18 is a diagram illustrating threshold voltages of memory cells MC when three bits are programmed at each memory cell. FIG. 19 shows a timeline for voltage and data for a process in which a first program loop is performed when three bits are programmed at each memory cell. In FIG. 18, the abscissa represents a threshold voltage. The ordinate represents the number of memory cells. In FIG. 19, the abscissa represents a time T. The ordinate represents data transmitted through input/output lines DQ and a voltage V applied to a word line connected to selected memory cells.

Referring to FIGS. 3, 18, and 19, each memory cell may have one of an erase state E and first to third program states P1 to P7. To program memory cells, data D_P1, D_P2, and D_P3 corresponding to three pages may be loaded on the page buffer circuit 115. Three data latches DL (refer to FIG. 4) may be connected to one bit line BL. Three bits corresponding to, respectively, three pages may be loaded on three data latches DL, respectively.

In an embodiment, as described with reference to FIGS. 7, 12, 13, and 14, data of a page in which a bit corresponding to the erase state E and a bit corresponding to the first program state P1 are different from each other may be first of all loaded on the page buffer circuit 115 as the first data D_P1. Data D_P2 and D_P3 of the remaining two pages may be loaded on the page buffer circuit 115 while a program of a first program loop of a program operation is performed.

In an embodiment, as described with reference to FIGS. 7, 15, and 16, data of a page in which a bit corresponding to the erase state E and a bit corresponding to the first program state P1 are equal to each other may be first of all loaded on the page buffer circuit 115 as the first data D_P1. For example, data of a page in which a bit of the seventh program state P7 (e.g., the highest program state) or the sixth program state P6 (e.g., a lower program state just adjacent to the highest program state) indicates not program-inhibit but program may be first of all loaded on the page buffer circuit 115 as the first data D_P1. Data D_P2 and D_P3 of the remaining two pages may be loaded on the page buffer circuit 115 while a program of a first program loop of a program operation is performed.

In an embodiment, programming of memory cells may be completed through one program operation from an erase state. That programming is completed may mean that all bits to be written at memory cells are written and additional program associated with the memory cells is inhibited. The scope and spirit of the programming described herein may be applied to the case that memory cells are programmed through one program operation or the case that programming is completed when a program operation is repeated twice or more.

Figure 20:
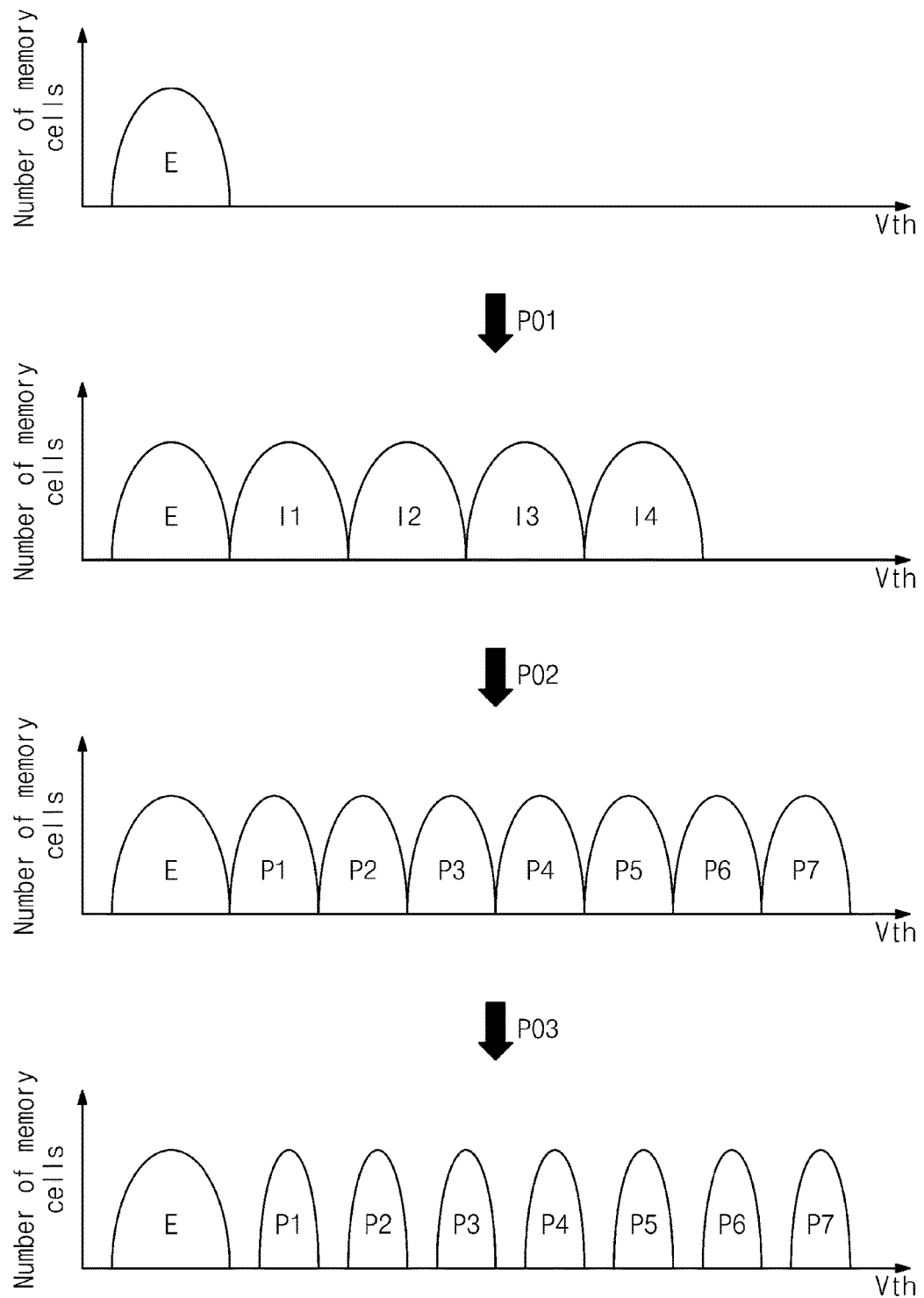
FIG. 20 shows an example in which memory cells are programmed through two or more program operations.

FIG. 20 shows an example in which memory cells are programmed through two or more program operations. In FIG. 20, the abscissa represents a threshold voltage. The ordinate represents the number of memory cells.

Referring to FIGS. 3 and 20, memory cells may be completely programmed through three program operations PO1 to PO3. In FIG. 20, it may be assumed that three bits are programmed at each memory cell.

During the first program operation PO1, memory cells may be programmed from the erase state E to the erase state E and the first to fourth intermediate program states I1 to I4. Data of at least two pages may be required to perform the first program operation PO1. As described with reference to FIGS. 1 to 19, a program operation may start after data of one page of the at least two pages is loaded on the page buffer circuit 115. Data of the remaining page may be loaded on the page buffer circuit 115 while a program of a first program loop of the program operation is performed.

In an embodiment, after the program operation starts, data of a second page may be loaded on the page buffer circuit 115. Afterwards, a verification of the first program loop may be performed. In an embodiment, data of a third page may be loaded on the page buffer circuit 115 while the program operation continues after the verification of the first program loop. Since not used for the first program operation PO1, the data of the third page may be loaded on the page buffer circuit 115 in parallel with the program operation.

The first program operation PO1 may be coarsely performed. For example, since memory cells where the first program operation PO1 is performed are not memory cells to be read, the first program operation PO1 may be coarsely performed without considering a read error.

Data of at least two pages loaded on the page buffer circuit 115 may be programmed separately at a backup area. For example, a bit may be programmed at each of memory cells of the backup area.

During the second program operation PO2, memory cells may be programmed to the erase state E and the first to fourth intermediate program states P1 to P7. In an embodiment, when data of a third page is not loaded during the first program operation PO1, data of the third page may be loaded when the second program operation PO2 starts. The second program operation PO2 may be performed based on data programmed at the backup area or both data programmed at the backup area and data of the third page loaded on the page buffer circuit 115 from the controller 120 (refer to FIG. 1).

The second program operation PO2 may be coarsely performed. For example, since memory cells where the second program operation PO2 is performed are not memory cells to be read, the second program operation PO2 may be coarsely performed without considering a read error.

During the third program operation PO3, a threshold voltage distribution of memory cells may be finely programmed. The third program operation PO3 may be performed based on data programmed at the backup area. Memory cells may be completely programmed as the third program operation PO3 is performed.

Figure 21:
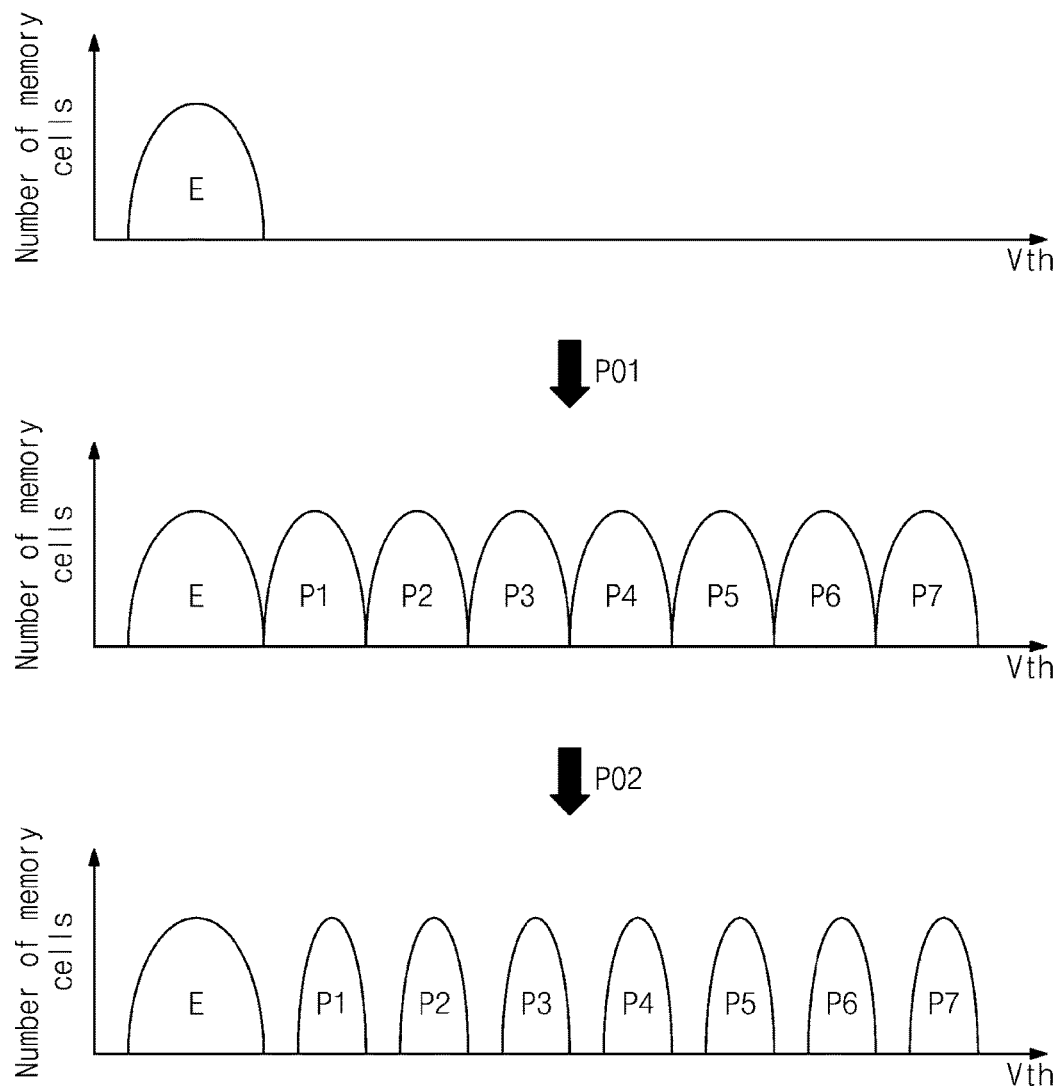
FIG. 21 shows another example in which memory cells are programmed through two or more program operations.

FIG. 21 shows another example in which memory cells are programmed through two or more program operations. In FIG. 46, the abscissa represents a threshold voltage. The ordinate represents the number of memory cells.

Referring to FIGS. 3 and 21, memory cells may be completely programmed by performing two program operations PO1 and PO2. In FIG. 21, it may be assumed that three bits are programmed at each memory cell.

During the first program operation PO1, memory cells may be programmed from the erase state E to the erase state E and the first to seventh program states P1 to P7. In an embodiment, the first program operation PO1 may correspond to the second program operation PO2 of FIG. 20.

A program operation may start after data of a first page is loaded on the page buffer circuit 115. Data of the remaining pages may be loaded on the page buffer circuit 115 while a program of a first program loop is performed.

The second program operation PO2 may be performed after the first program operation PO1 is performed. The second program operation PO2 may correspond to the third program operation PO3 of FIG. 20. Memory cells may be completely programmed as the second program operation PO2 is performed.

Figure 22:
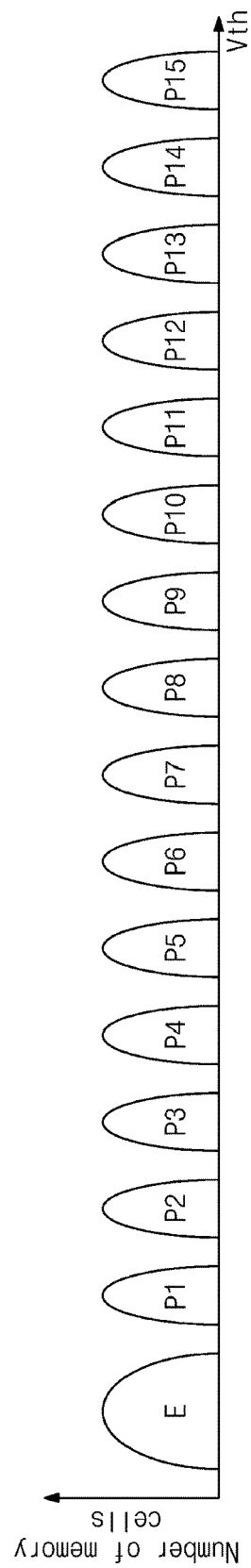
FIG. 22 is a diagram illustrating threshold voltages of memory cells when four bits are programmed at each memory cell.

FIG. 22 is a diagram illustrating threshold voltages of memory cells when four bits are programmed at each memory cell. In FIG. 22, the abscissa represents a threshold voltage. The ordinate represents the number of memory cells.

Referring to FIGS. 3 and 22, each memory cell may have one of an erase state E and 1st to 15th program states P1 to P15. To program memory cells, data corresponding to four pages may be loaded on the page buffer circuit 115. Four data latches DL (refer to FIG. 4) may be connected to one bit line BL. Four bits corresponding to, respectively, four pages may be loaded on four data latches DL, respectively.

A program operation may be performed after data of a first page is loaded on the page buffer circuit 115. Data of the remaining pages or data of a part of the remaining pages may be loaded on the page buffer circuit 115 while a program of a first program loop is performed.

Figure 23:
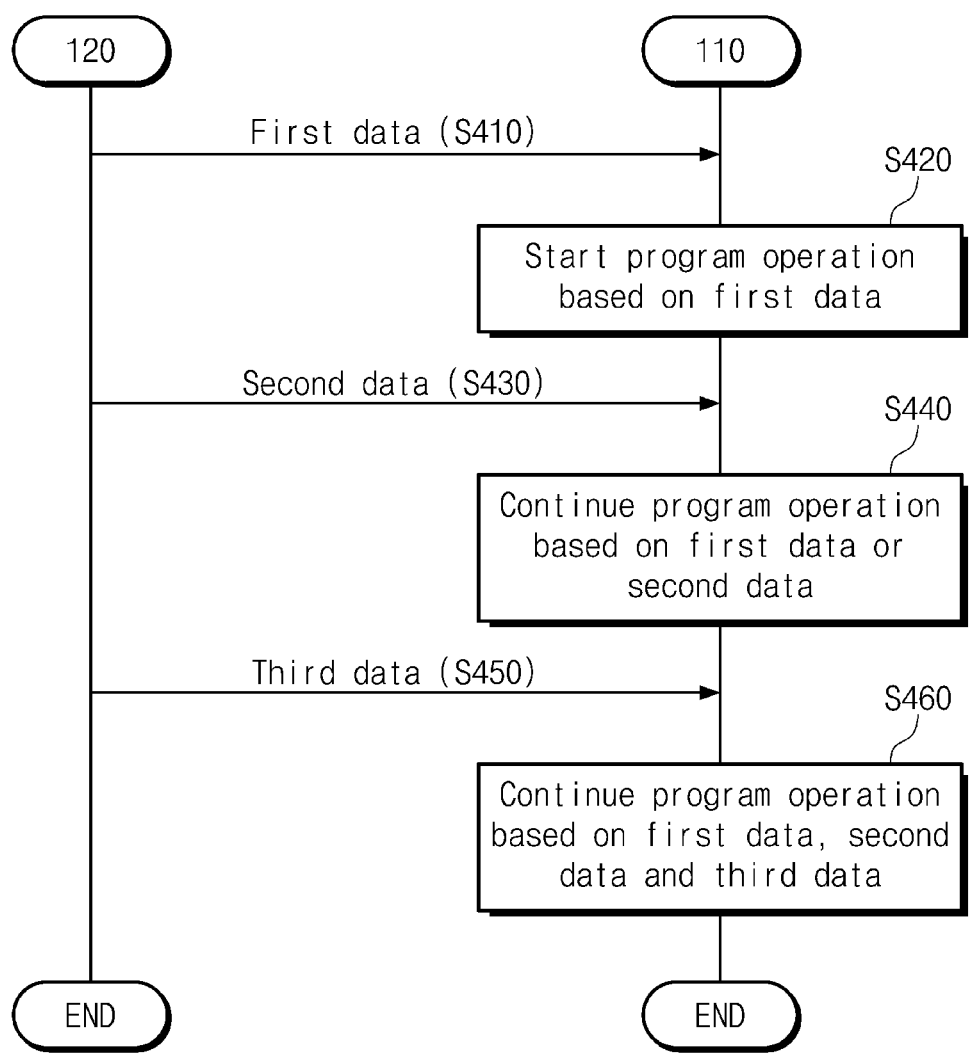
FIG. 23 is a flowchart illustrating an example in which a program operation is performed by the program control unit of a nonvolatile memory device and a program control unit of a controller.

FIG. 23 is a flowchart illustrating an example in which a program operation is performed by the program control unit PCU1 of the nonvolatile memory device 110 and the program control unit PCU2 of the controller 120. Referring to FIGS. 1 and 23, in step S410, the program control unit PCU2 of the controller 120 may provide first data to the nonvolatile memory device 110. For example, the first data may include data corresponding to at least one logical page among logical pages belonging to one physical page.

After the first data is sent to the nonvolatile memory device 110, in step S420, the nonvolatile memory device 110 may initiate a program operation based on the first data. After the program operation starts, the program control unit PCU1 of the nonvolatile memory device 110 may switch the ready/busy signal to a ready state to notify the controller 120 that it is possible to receive data additionally.

In step S430, the program control unit PCU2 of the controller 120 may provide second data to the nonvolatile memory device 110 while the program operation is performed on the nonvolatile memory device 110. For example, the second data may include data corresponding to at least one logical page among logical pages belonging to one physical page.

As the second data is received, in step S440, the nonvolatile memory device 110 may continue to perform the program operation based on the first data and the second data. For example, the nonvolatile memory device 110 may continue to perform the program operation, which is initiated in step S420, based on the first data and the second data. As another example, the nonvolatile memory device 110 may continue to perform the program operation, which is initiated in step S420, based on the second data. After the program operation starts, the program control unit PCU1 of the nonvolatile memory device 110 may switch the ready/busy signal to a ready state to notify the controller 120 that it is possible to receive data additionally.

In step S450, the program control unit PCU2 of the controller 120 may provide third data to the nonvolatile memory device 110 while the program operation is performed on the nonvolatile memory device 110. For example, the third data may include data corresponding to at least one logical page among logical pages belonging to one physical page.

As the third data is received, in step S460, the nonvolatile memory device 110 may continue to perform the program operation based on the first data, the second data, and the third data. For example, the nonvolatile memory device 110 may continue to perform the program operation, which is initiated in step S420, based on the first data, the second data, and the third data.

According to embodiments of the present disclosure, the program operation may start after a portion of data (e.g., the first data) to be programmed through the program operation is sent to the nonvolatile memory device 110. The rest of the data (e.g., the second data and the third data) to be programmed may be provided to the nonvolatile memory device 110 while the program operation is performed. As the second data or the third data is received, the nonvolatile memory device 110 may continue to perform the program operation based on the second data or the third data. Accordingly, a time when the second data is provided to the nonvolatile memory device 110 may be shadowed by a time when the program operation is performed, thereby reducing a time needed to perform a program operation of the storage device 100.

In an embodiment, step S410 and step S460 may be continuously performed. For example, to request a read operation, an erase operation, or another program operation from the nonvolatile memory device 110 may not be allowed while the program operation of steps S410 to S440 is performed.

In an embodiment, step S410 to step S460 may be an entirety or a portion of the program operation. For example, memory cells of the nonvolatile memory device 110 may be programmed according to a high-speed program (HSP) scheme. In the HSP scheme, memory cells may be completely programmed by performing a program operation once. A program operation that is additionally performed with respect to the program-completed memory cells may be prohibited. As another example, memory cells of the nonvolatile memory device 100 may be programmed according to a reprogram scheme. In the reprogram scheme, memory cells may be completely programmed through two or more program operations. For example, an operation of reading memory cells before the program operation is completed may be prohibited. A program operation that is additionally performed with respect to the memory cells completely programmed through two or more program operations may be prohibited.

Figure 24:
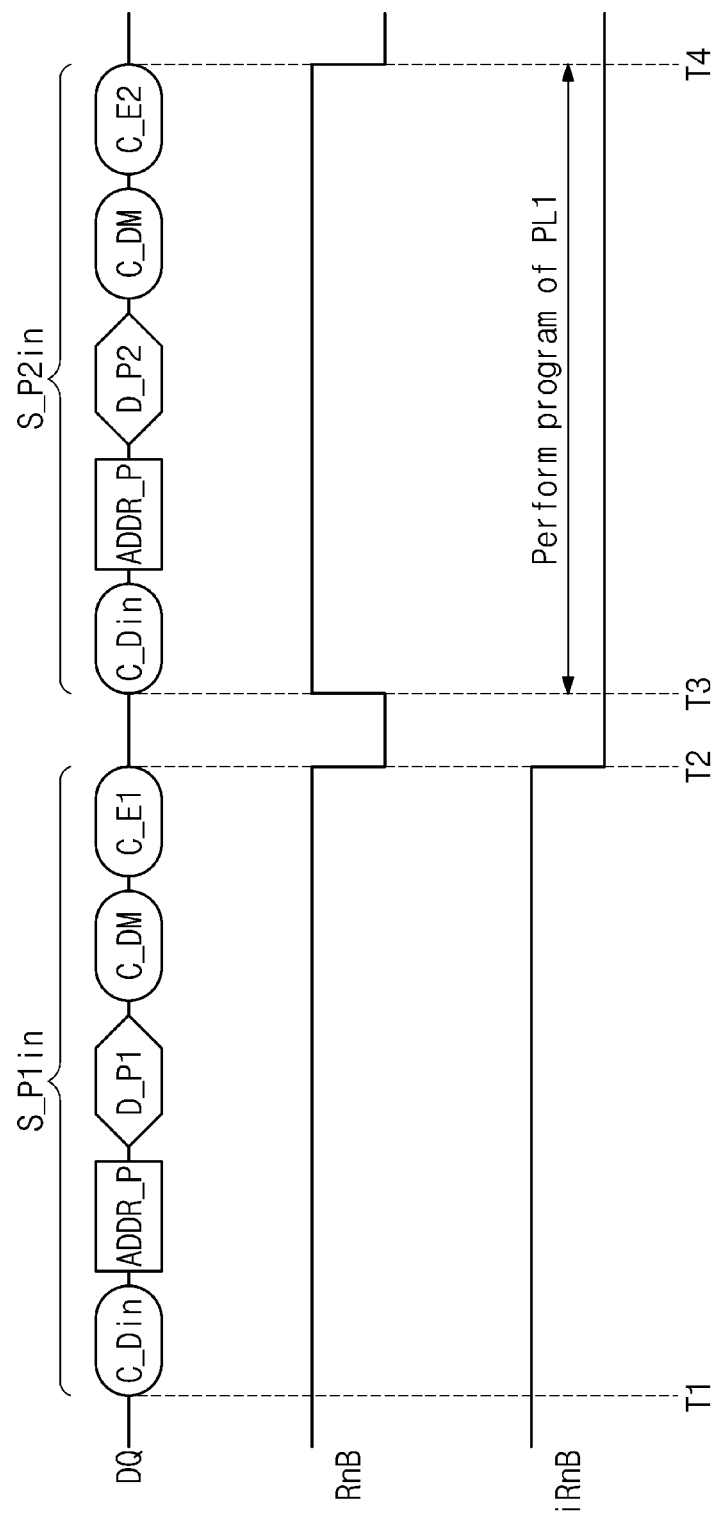
FIGS. 24 and 25 are timing diagrams illustrating a program operation according to an embodiment of the present disclosure, when viewed from input/output lines and a ready/busy signal.
Figure 25:
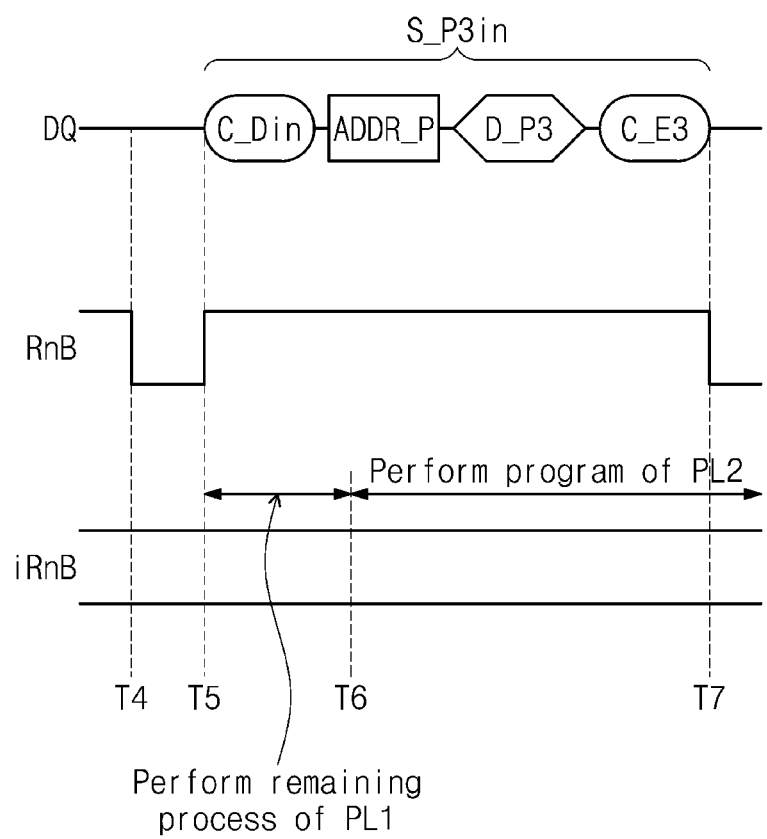

FIGS. 24 and 25 are timing diagrams illustrating a program operation according to an embodiment of the present disclosure, when viewed from input/output lines DQ and a ready/busy signal RnB. Referring to FIGS. 1, 3, 24, and 25, at T1, the controller 120 may output a first sequence S_P1 through the input/output lines DQ. For example, the controller 120 may output a data input command C_Din, an address ADDR_P, first data D_P1, a dump command C_DM, and an end command C_E1. The data input command C_Din may be "80h" indicating that data to be programmed is provided. The address ADDR_P may indicate memory cells in which data is to be programmed, for example, an address of a physical page. The first data D_P1 may be data of one among logical pages belonging to a physical page corresponding to the address ADDR_P. The dump command C_DM may be a command for requesting the dump of data and may be "C0h". The end command C_E1 may be "11h" indicating that data of a first logical page is completely transmitted.

While the first input sequence S_P1in progresses, the nonvolatile memory device 110 may maintain the ready/busy signal RnB at a ready state of a high level. An internal ready/busy signal iRnB may indicate whether an operation is performed in the nonvolatile memory device, independently of the ready/busy signal RnB that the nonvolatile memory device 110 outputs to the controller 120. While the first input sequence S_P1in progresses, the internal ready/busy signal iRnB may be maintained at a ready state of a high level.

In the first input sequence S_P1in, the first data D_P1 provided from the controller 120 to the nonvolatile memory device 110 through the input/output lines DQ may be stored in the cache latches CL. When receiving the dump command C_DM and the end command C_E1 through the input/output lines DQ, the nonvolatile memory device 110 may dump the first data D_P1 loaded on the cache latches CL onto the first data latches DL1 or the second data latches DL2. While the nonvolatile memory device 110 dumps the first data D_P1, a state of the internal ready/busy signal iRnB of the nonvolatile memory device 110 may be switched from the ready state of the high level to a busy state of a low level at T2. A state of the ready/busy signal RnB may be switched from the ready state of the high level to the busy state of the low level. When the first data D_P1 is completely dumped, at T3, a state of the ready/busy signal RnB may be changed into the ready state of the high level.

At T3, the nonvolatile memory device 110 may initiate the program of the first segment PL1. When the control circuit CC and the cache latch CL are ready to receive data during the program of the first program loop PL1, the nonvolatile memory device 110 may make the ready/busy signal RnB transition to the ready state of the high level. In an embodiment, program or program and verification read may be performed between the second data input sequence S_P2in progresses.

The controller 120 may perform the second data input sequence S_P2in when the ready/busy signal RnB transitions to the ready state of the high level. For example, the controller 120 may sequentially provide a data input command C_Din, an address ADDR_P, second data D_P2, a dump command C_DM, and an end command C_E2 to the nonvolatile memory device 110. As in first data input sequence S_P1in, the controller 120 may provide the second data D_P2 to the nonvolatile memory device 110 in the second data input sequence S_P2in. The second data D_P2 may be data of a second logical page to be programmed in memory cells corresponding to the address ADDR_P. The end command C_E2 may indicate that data of a second logical page is completely transmitted.

When receiving the dump command C_DM and the end command C_E2 through the input/output lines DQ, the nonvolatile memory device 110 may dump the second data D_P2 loaded on the cache latches CL onto the first data latches DL2 or the second data latches DL1. While the nonvolatile memory device 110 dumps the second data D_P2, a state of the ready/busy signal RnB of the nonvolatile memory device 110 may be switched from the ready state of the high level to a busy state of a low level at T4. When the second data D_P2 is completely dumped, at T5, a state of the ready/busy signal RnB may be changed into the ready state of the high level.

At T5, the nonvolatile memory device 110 may perform the remaining processes of the first program loop PL1. For example, selection dump, inhibit dump, and pass-fail check of the first program loop PL1 or verification read, selection dump, inhibit dump, and pass-fail check of the first program loop PL1 may be performed.

Furthermore, the controller 120 may perform the third data input sequence S_P3in when the ready/busy signal RnB transitions to the ready state of the high level. For example, the controller 120 may sequentially provide a data input command C_Din, an address ADDR_P, third data D_P3, and an end command C_E3 to the nonvolatile memory device 110. The third data D_P3 may be data of a third logical page to be programmed in memory cells corresponding to the address ADDR_P. The end command C_E3 may indicate that data of a third logical page is completely transmitted.

In the case where the first program loop PL1 is completed at T6 while the third data input sequence S_P3in is performed, the nonvolatile memory device 110 may perform a program of the second program loop PL2. For example, the nonvolatile memory device 110 may perform the second program loop PL2 based on the first data D_P1 or the first and second data D_P1 and D_P2. For example, the nonvolatile memory device 110 may perform a program of the second program loop PL2 or a program and a verification read of the second program loop PL2.

When the third data input sequence S_P3in is completed at T7, the nonvolatile memory device 110 may continue to perform the program operation based on the first data D_P1, the second data D_P2, and the third data D_P3.

In an embodiment, after the program operation is completed or when it is possible to receive a next command, the ready/busy signal RnB may return to a ready state of a high level.

As described with reference to FIGS. 23 to 25, it may be necessary to send data three times to the nonvolatile memory device in which 3-bit data is stored per memory cell, to perform a program operation. However, in the case where a program loop progresses while a second data transfer operation is performed after a first data transfer operation is performed, a data transfer time may be shadowed by a program time that is fully or partially simultaneous. Furthermore, in the case where one program loop additionally progresses while a third data transfer operation is performed, a data transfer time may be additionally shadowed by the program time that is fully or partially simultaneous. Accordingly, the operating speed of the storage device 100 may be improved.

Figure 26:
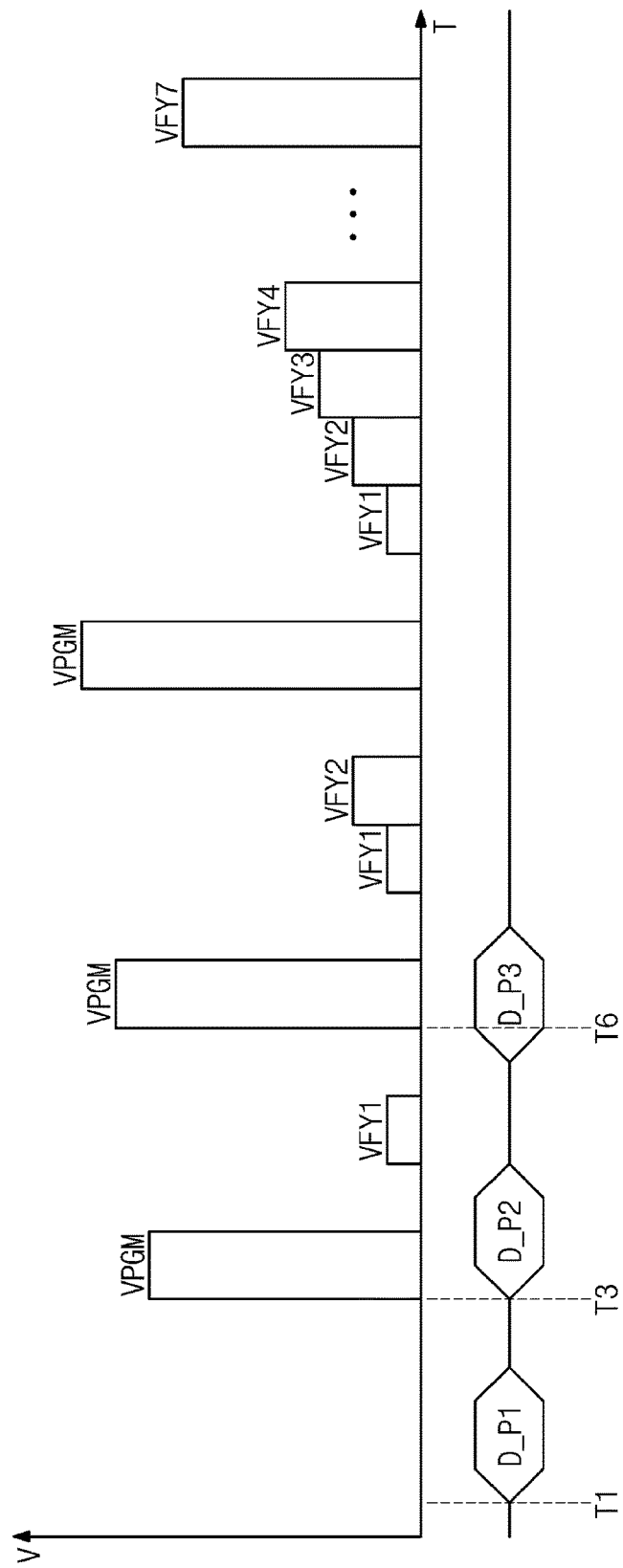
FIG. 26 shows a timeline for voltage and data for a process in which a first program loop is performed at memory cells based on the method of FIG. 23.

FIG. 26 shows a timeline for voltage and data for a process in which a first program loop is performed at memory cells based on the method of FIG. 23. In FIG. 26, the abscissa represents a time T. The ordinate represents data transmitted through input/output lines DQ and a voltage V applied to a word line connected to selected memory cells.

Referring to FIGS. 3 and 24 to 26, at T1, first data D_P1 may be provided to the page buffer circuit 115 through the input/output lines DQ. When the program of the first program loop PL1 starts at T3, the page buffer circuit 115 may set up bit lines BL based on the first data D_P1. For example, the page buffer circuit 115 may classify the bit lines into bit lines to be program-inhibited and bit lines to be programmed. The row decoder circuit 113 may apply a program voltage VPGM to a selected word line. While the program voltage VPGM is applied to the selected word line, second data D_P2 may be provided to the page buffer circuit 115 through the input/output lines DQ.

In an embodiment, the verification read of the first program loop PL1 may be performed with respect to an erase state E and a program state P1 corresponding to the lowest threshold voltage (or the lowest threshold voltage distribution range). For example, the verification read of the first program loop PL1 may be performed by using a first verification voltage VFY1. The verification read of the first program loop PL1 may be performed by using the first data D_P1 while the second data D_P2 is received or by using the first data D_P1 and the second data D_P2 after the second data D_P2 is received. The selection dump, inhibit dump, and pass-fail check of the first program loop PL1 may be performed by using the first data D_P1 and the second data D_P2 after the second data D_P2 is received.

When the program of the second program loop PL2 starts at T6, the page buffer circuit 115 may set up bit lines BL based on the first data D_P1, the second data D_P2, or the first and second data D_P1 and D_P2. For example, the page buffer circuit 115 may classify the bit lines into bit lines to be program-inhibited and bit lines to be programmed. The row decoder circuit 113 may apply the program voltage VPGM to the selected word line. While the program voltage VPGM is applied to the selected word line, third data D_P3 may be provided to the page buffer circuit 115 through the input/output lines DQ.

In an embodiment, the verification read of the second program loop PL2 may be performed with respect to a program state P1 corresponding to the lowest threshold voltage (or the lowest threshold voltage distribution range) and the second lowest threshold voltage (or the second lowest threshold voltage distribution range) and with respect to the erase state E and the program state P1 corresponding to the lowest threshold voltage. For example, the verification read of the second program loop PL2 may be performed by using the first verification voltage VFY1 and a second verification voltage VFY1. The verification read of the second program loop PL2 may be performed by using the first data D_P1 and the second data D_P2 while the third data D_P3 is received or by using the first data D_P1, the second data D_P2, and the third data D_P3 after the third data D_P3 is received. The selection dump, inhibit dump, and pass-fail check of the first program loop PL1 may be performed by using the first data D_P1, the second data D_P2, and the third data D_P3 after the third data D_P3 is received.

In an embodiment, in a second program loop PL2, a verification read that uses the first verification voltage VFY1 may be performed while the third data D_P3 is received. In the second program loop PL2, the selection dump using the first verification voltage VFY1, inhibit dump, and the verification using the second verification voltage VFY2 may be performed by using the first data D_P1, the second data D_P2, and the third data D_P3 after the third data D_P3 is received.

When the third data D_P3 is completely received, the nonvolatile memory device 110 may perform a normal program operation based on the first data D_P1, the second data D_P2, and the third data D_P3. For example, the nonvolatile memory device 110 may classify bit lines into bit lines to be program-inhibited and bit lines to be programmed based on the first data D_P1, the second data D_P2, and the third data D_P3. After the program voltage VPGM is applied to the selected word line, the nonvolatile memory device 110 may perform verification reads by using first to seventh verification voltages VFY1 to VFY7 corresponding to program states. With regard to each verification read using each verification voltage, the nonvolatile memory device 110 may perform the selection dump, inhibit dump, and pass-fail check based on the first data D_P1, the second data D_P2, and the third data D_P3.

Figure 27:
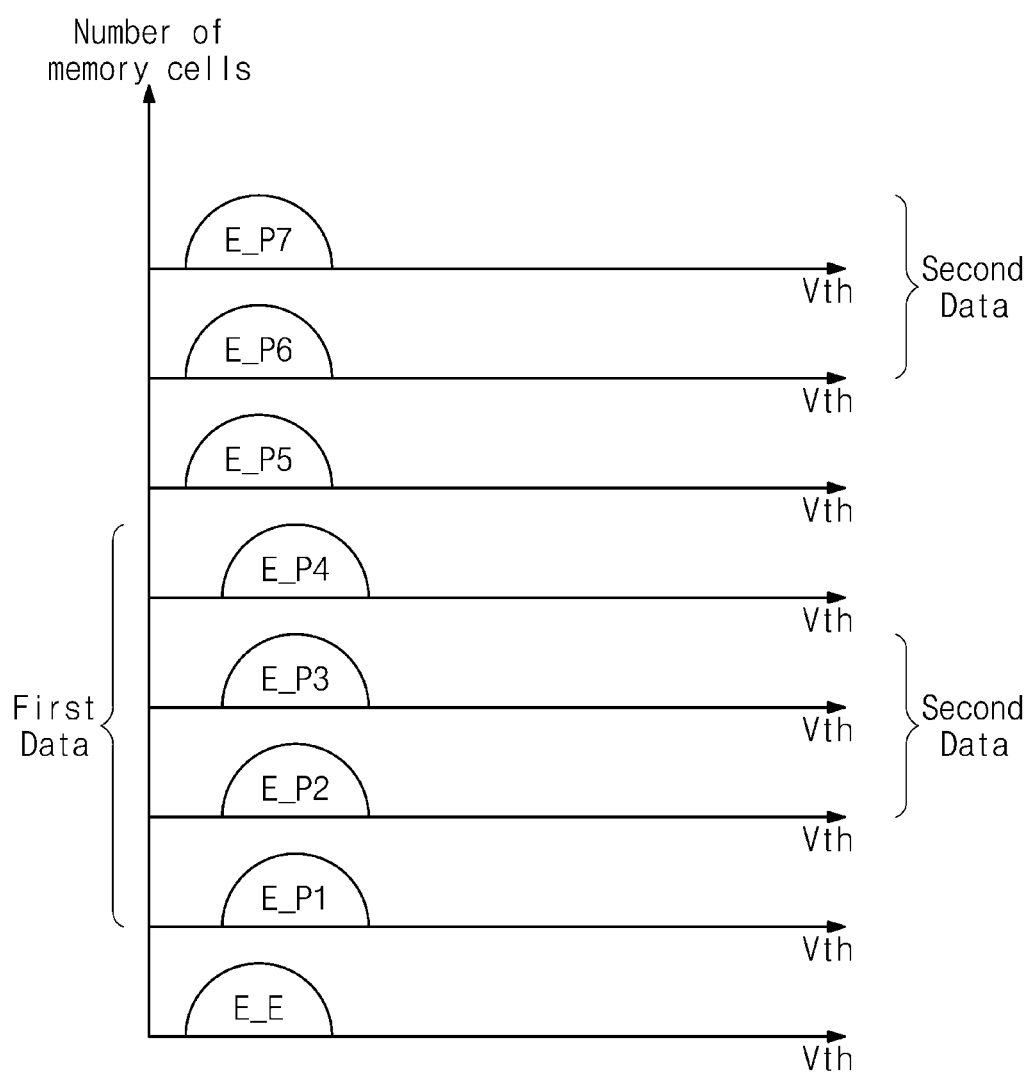
FIGS. 27 and 28 are drawings illustrating examples in which threshold voltages of memory cells are changed as program loops of a program operation of FIG. 26 are performed.
Figure 28:
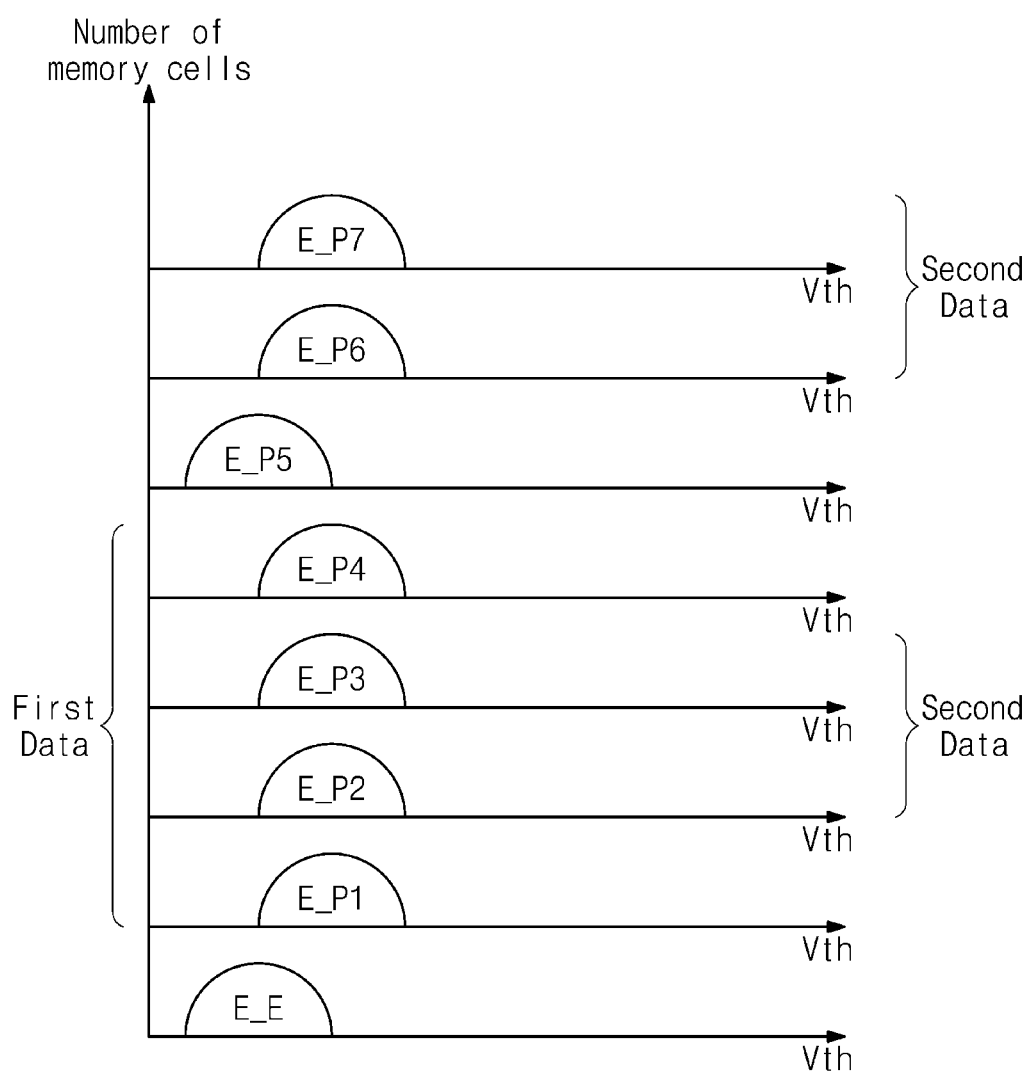

FIGS. 27 and 28 are drawings illustrating examples in which threshold voltages of memory cells are changed as program loops of a program operation of FIG. 26 are performed. In FIG. 27, the abscissa represents threshold voltages Vth of memory cells. The ordinate represents the number of memory cells MC.

Referring to FIGS. 23 to 27, a reference character "E_E" may indicate memory cells the erase state E of each of which is maintained during a program operation. The inhibit memory cells E_E indicate memory cells that maintain an erase state because program-inhibited during the program operation. Program memory cells E_P1 to E_P7 indicate memory cells to be programmed to the first to seventh program states P1 to P7.

In an embodiment, the first data D_P1 may indicate whether memory cells belong to the first to fourth program memory cells E_P1 to E_P4. The second data D_P2 may indicate whether memory cells belong to the second, third, sixth, and seventh program memory cells E_P2, E_P3, E_P6, and E_P7.

A program of the first program loop PL1 may be performed by using the first data D_P1. As such, threshold voltages of the first to fourth program memory cells E_P1 to E_P4 may increase together. During a verification read of the first program loop PL1, whether threshold voltages of the first to fourth program memory cells E_P1 to E_P4 are higher than the first verification voltage VFY1 may be determined. Memory cells that are determined as having a threshold voltage higher than the first verification voltage VFY1 during the verification read may be program-inhibited. When the second data D_P2 is received, the selection dump and inhibit dump may be performed. Memory cells that are programmed to a program state higher than the first program state P1 corresponding to the first verification voltage VFY1 may be released from a program inhibit state based on the first data D_P1 and the second data D_P2. For example, the second, third, sixth, and seventh program memory cells E_P2, E_P3, E_P6, and E_P7 may be released from the program inhibit state.

Referring to FIGS. 23 to 28, the second program loop PL2 may be performed based on the first data D_P1 and the second data D_P2. As such, threshold voltages of program memory cells E_P1 to E_P4, E_P6, and E_P7 among memory cells that are not program-inhibited may increase.

Figure 29:
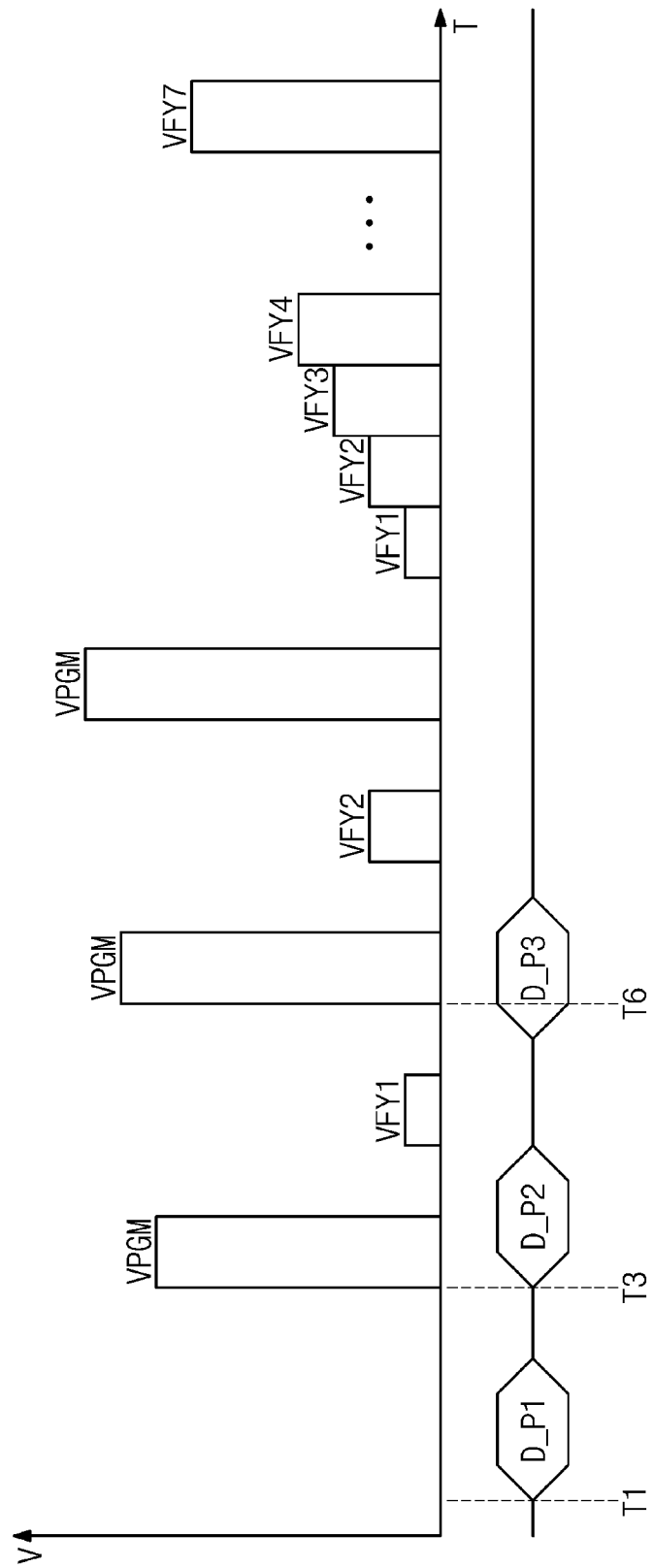
FIG. 29 is a timeline for voltage and data for another process in which a program loop is performed at memory cells based on the method of FIG. 23.

FIG. 29 is a timeline for voltage and data for another process in which a program loop is performed at memory cells based on the method of FIG. 48. In FIG. 54, the abscissa represents a time T. The ordinate represents data transmitted through input/output lines DQ and a voltage V applied to a word line connected to selected memory cells.

As compared to a second program loop PL2 of FIG. 26, in a second program loop PL2, the second verification voltage VFY2 may be used, while the first verification voltage VFY1 may not be used. For example, a program and a verification read of the second program loop PL2 may be performed by using the second data D_P2.

Figure 30:
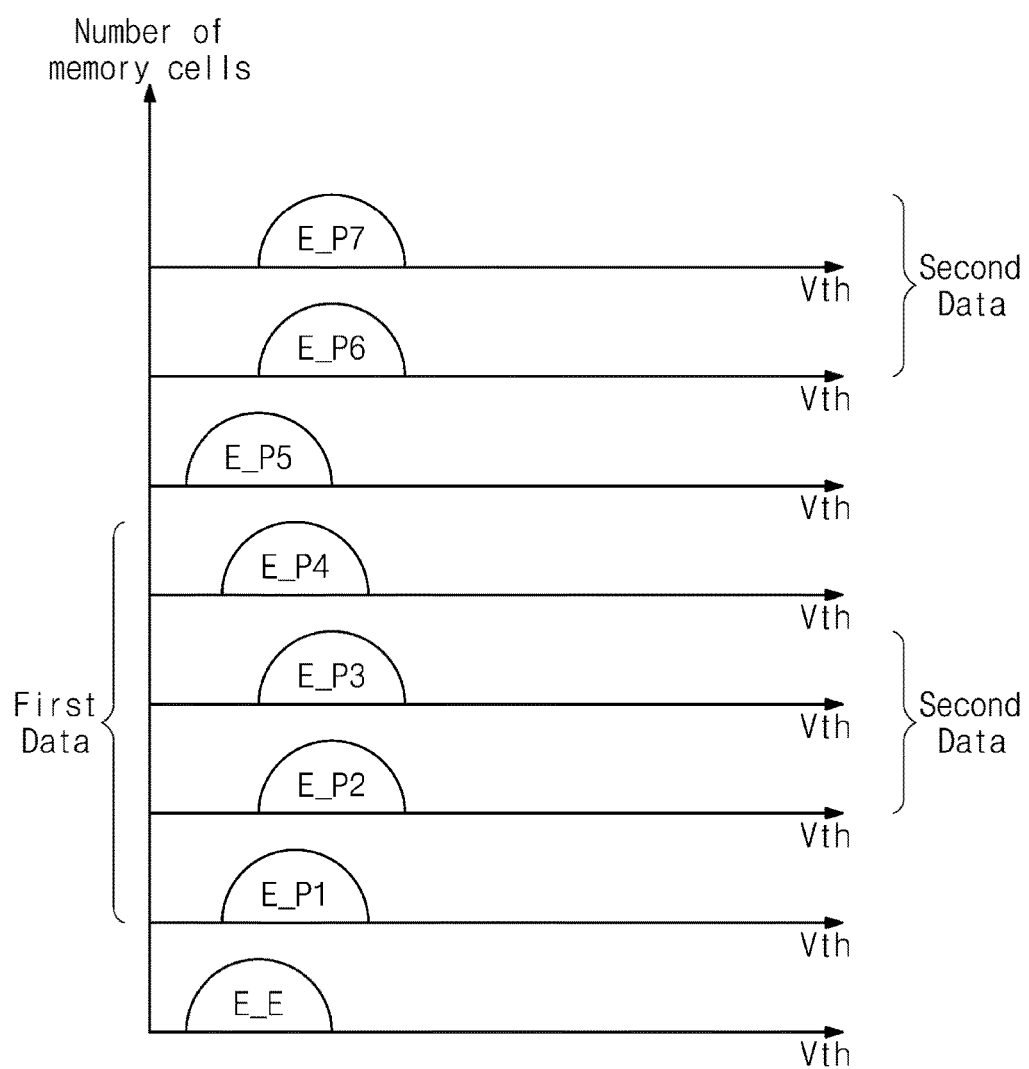
FIG. 30 is a drawing illustrating an example in which threshold voltages of memory cells are changed as program loops of a program operation of FIG. 29 are performed.

FIG. 30 is a drawing illustrating an example in which threshold voltages of memory cells are changed as program loops of a program operation of FIG. 29 are performed. In FIG. 30, the abscissa represents threshold voltages Vth of memory cells. The ordinate represents the number of memory cells. In FIG. 30, there is illustrated an example in which memory cells illustrated in FIG. 27 are programmed by a second program loop PL2 of FIG. 29.

As compared to a second program loop PL2 of FIG. 27, second, third, sixth, and seventh program memory cells E_P2, E_P3, E_P6, and E_P7 that are distinguished by the second data D_P2 may be programmed in a second program loop PL2. During a verification read of the second program loop PL2, whether threshold voltages of the second, third, sixth, and seventh program memory cells E_P2, E_P3, E_P6, and E_P7 are higher than the second verification voltage VFY2 may be determined. Memory cells that are determined as having a threshold voltage higher than the second verification voltage VFY2 during the verification read may be program-inhibited.

Figure 31:
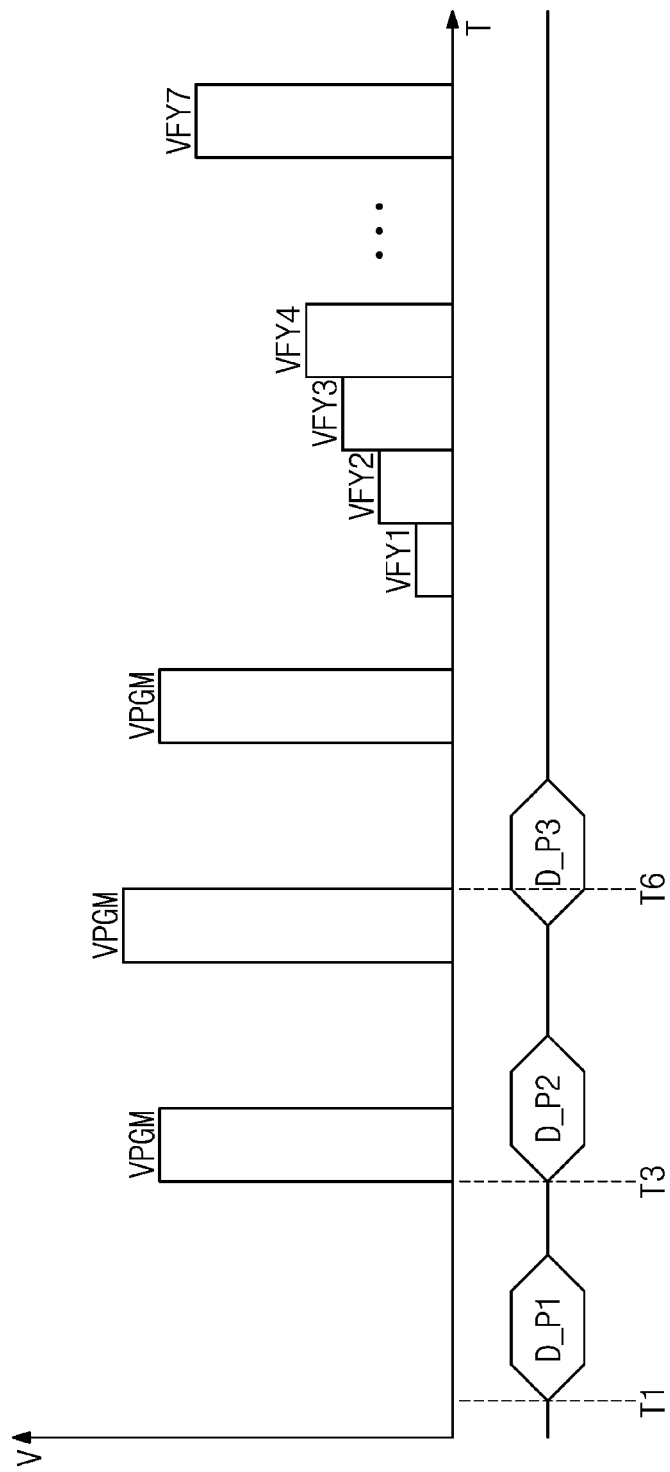
FIG. 31 is a timeline for voltage and data for another process in which a program loop is performed at memory cells based on the method of FIG. 23.

FIG. 31 is a timeline for voltage and data for another process in which a program loop is performed at memory cells based on the method of FIG. 23. In FIG. 31, the abscissa represents a time T. The ordinate represents data transmitted through input/output lines DQ and a voltage V applied to a word line connected to selected memory cells.

As compared to the first and second program loops PL1 and PL2 of FIG. 26, a verification voltage may not be used in the first program loop PL1 and the second program loop PL2. That is, the verification may not be performed. In an embodiment, relatively high program states, for example, a fourth, fifth, sixth, or seventh program state P4, P5, P6, or P7 may be distinguished based on the first data D_P1. In the first program loop PL1 and the second program loop PL2, threshold voltages of memory cells corresponding to relatively high program states may increase in advance. Accordingly, since the fluctuations of threshold voltages of memory cells are reduced in a following program loop, a stress applied to the memory cells may decrease. This may mean that the reliability of memory cells is improved. Since memory cells corresponding to relatively high program states are programmed in the first program loop PL1 and the second program loop PL2, the memory cells may be prevented from being over-programmed.

Figure 32:
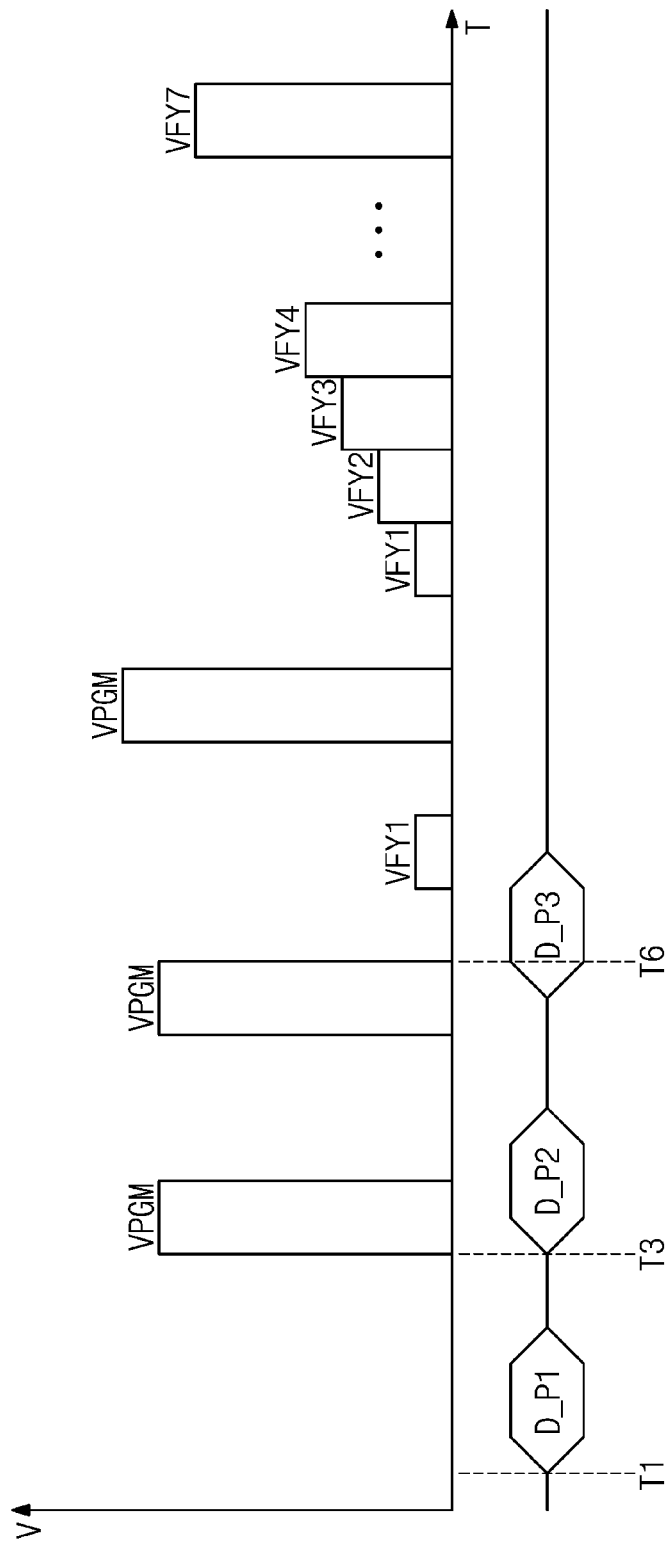
FIG. 32 is a timeline for voltage and data for another process in which a program loop is performed at memory cells based on the method of FIG. 23.

FIG. 32 is a timeline for voltage and data for another process in which a program loop is performed at memory cells based on the method of FIG. 23. In FIG. 32, the abscissa represents a time T. The ordinate represents data transmitted through input/output lines DQ and a voltage V applied to a word line connected to selected memory cells.

As compared to the first program loop PL1 of FIG. 26, a verification may not be performed in the first program loop PL1. Relatively high program states, for example, a fourth, fifth, sixth, or seventh program state P4, P5, P6, or P7 may be distinguished based on the first data D_P1. In the first program loop PL1, memory cells corresponding to relatively high program states may be programmed in advance. The first verification voltage VFY1 may be used in the second program loop PL2. In an embodiment, the second data D_P2 may be used to distinguish the erase state E and the lowest first program state P1. Accordingly, the second data D_P2 may be used to perform a verification using the first verification voltage VFY1.

FIG. 33 is a circuit diagram illustrating a memory block BLKa according to an embodiment of the present disclosure. Referring to FIG. 33, a memory block BLKa may include multiple cell strings CS11 to CS21 and CS12 to CS22. The multiple cell strings CS11 to CS21 and CS12 to CS22 may be arranged along a row direction and a column direction to constitute rows and columns.

For example, the cell strings CS11 and CS12 arranged along the row direction may constitute a first row. The cell strings CS21 and CS22 arranged along the row direction may constitute a second row. The cell strings CS11 and CS21 arranged along the column direction may constitute a first column. The cell strings CS12 and CS22 arranged along the column direction may constitute a second column.

Each cell string may contain multiple cell transistors. The cell transistors may include ground selection transistors GST, memory cells MC1 to MC6, and string selection transistors SSTa and SSTb. The ground selection transistor GST, memory cells MC1 to MC6, and string selection transistors SSTa and SSTb in each cell string may be stacked in a height direction perpendicular to a plane (e.g., a plane on a substrate of the memory block BLKa) on which the cell strings CS11 to CS21 and CS12 to CS22 are arranged along the rows and the columns.

Multiple cell transistors may be charge trap type cell transistors of which the threshold voltage changes according to the amount of charges trapped in an insulating layer thereof.

Sources of the lowermost ground selection transistors GST may be connected in common to a common source line CSL.

Control gates of ground selection transistors GSTa of the cell strings CS11 and CS12 in a first row may be connected in common to a ground selection line GSL1. Control gates of ground selection transistors GSTb of the cell strings CS21 and CS22 in a second row may be connected in common to a ground selection line GSL2. That is, cell strings in different rows may be connected to different ground selection lines.

Connected in common to a word line are control gates of memory cells that are placed at the same height (or order) from the substrate (or the ground selection transistors GST). Connected to different word lines WL1 to WL6 are control gates of memory cells that are placed at different heights (or, orders). For example, memory cells MC1 may be connected in common to a word line WL1. Memory cells MC2 may be connected in common to a word line WL2. Memory cells MC3 may be connected in common to a word line WL3. Memory cells MC4 may be connected in common to a word line WL4. Memory cells MC5 may be connected in common to a word line WL5. Memory cells MC6 may be connected in common to a word line WL6.

Cell strings in different rows may be connected to different string selection lines SSL1a and SSL2a or SSL1b and SSL2b. String selection transistors SSTa or SSTb, having the same height (or, order), of cell strings in the same row may be connected to the same string selection line. String selection transistors SSTa and SSTb, having different heights (or, orders), of cell strings in the same row may be connected to different string selection lines.

Columns of the cell strings CS11 to CS21 and CS12 to CS22 may be connected to different bit lines BL1 and BL2. For example, string selection transistors SSTb of the cell strings CS11 to CS21 in the first column may be connected in common to a bit line BL1. The string selection transistors SSTb of the cell strings CS12 and CS22 may be connected in common to the bit line BL2.

As described above, the memory block BLKa may be provided at a three-dimensional memory array. The 3D memory array is monolithically formed in one or more physical levels of arrays of memory cells MC having an active area disposed above a silicon substrate and a circuitry associated with the operation of those memory cells MC. The circuit associated with an operation of memory cells MC may be located above or within such substrate. The term "monolithic" means that layers of each level of the array are directly deposited on the layers of each underlying level of the 3D memory array.

In an embodiment of the present disclosure, the 3D memory array includes vertical NAND strings (or cell strings) that are vertically oriented such that at least one memory cell is located over another memory cell. The at least one memory cell MC may comprise a charge trap layer. Each vertical NAND string may further include at least one selection transistor placed over the memory cells MC. The at least one selection transistor may have the same structure as the memory cells MC and may be formed uniformly with the memory cells MC.

The following patent documents, which are hereby incorporated by reference, describe suitable configurations for three-dimensional memory arrays, in which the three-dimensional memory array is configured as multiple levels, with word lines and/or bit lines shared between levels: U.S. Pat. Nos. 7,679,133; 8,553,466; 8,654,587; 8,559,235; and US Pat. Pub. No. 2011/0233648.

Figure 34:
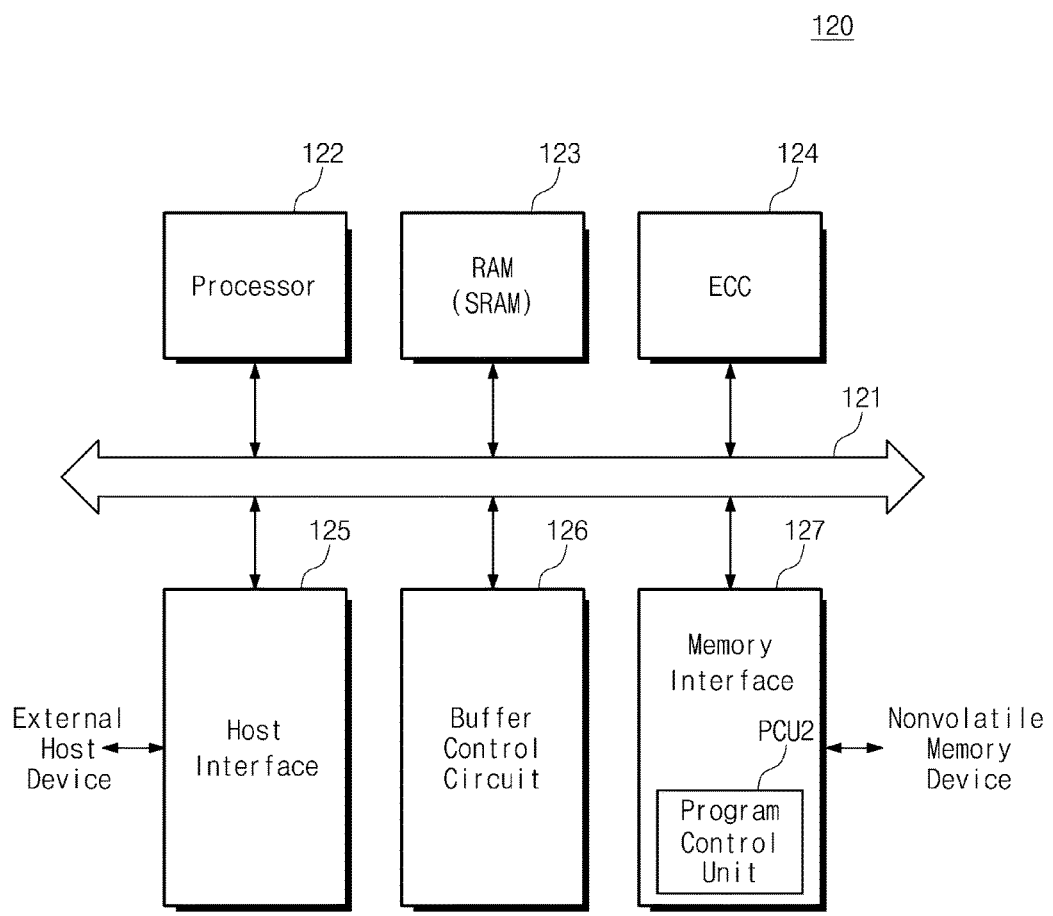
FIG. 34 is a block diagram illustrating a controller according to an embodiment of the present disclosure.

FIG. 34 is a block diagram illustrating a controller 120 according to an embodiment of the present disclosure. Referring to FIG. 34, the controller 120 may include a bus 121, a processor 122, a RAM 123, an ECC block 124, a host interface 125, a buffer control circuit 126, and a memory interface 127.

The bus 121 may be configured to provide a channel among components of the controller 120.

The processor 122 may control an overall operation of the controller 120 and may execute a logical operation. The processor 122 may communicate with an external host device through the host interface 125. The processor 122 may communicate with the nonvolatile memory package 110 through the memory interface 127. The processor 122 may communicate with the RAM 130 through the buffer control circuit 126. The processor 122 may control the storage device 100 using the RAM 123 as a working memory, a cache memory, or a buffer memory.

The RAM 123 may be used as a working memory, a cache memory, or a buffer memory of the processor 122. The RAM 123 may store codes or commands that the processor 122 will execute. The RAM 123 may store data processed by the processor 122. The RAM 123 may include a static RAM (SRAM).

The error correction block 124 may perform an error correction operation. The ECC block 124 may perform error correction encoding based on data to be written at the nonvolatile memory device 110 through the memory interface 127. The ECC block 124 may perform error correction decoding on data received through the memory interface 127 from the nonvolatile memory package 110.

The host interface 125 may communicate with the external host device under control of the processor 122. The buffer control circuit 126 may control the RAM 130 under a control of the processor 122

The memory interface 127 may communicate with the nonvolatile memory package 110 in response to control of the processor 122. The memory interface 127 may include the program control unit PCU2 according to an embodiment of the present disclosure. The program control unit PCU2 may control timing when a command, an address, or data is provided to the nonvolatile memory device 110 during a program operation. For example, the program control unit PCU2 may be configured to provide the nonvolatile memory device 110 with sequences as described with reference to FIGS. 5 and 6 or FIG. 17.

In an embodiment, in the case where the storage device 100 does not include the RAM 130, the controller 120 may not include the buffer control circuit 126.

Figure 35:
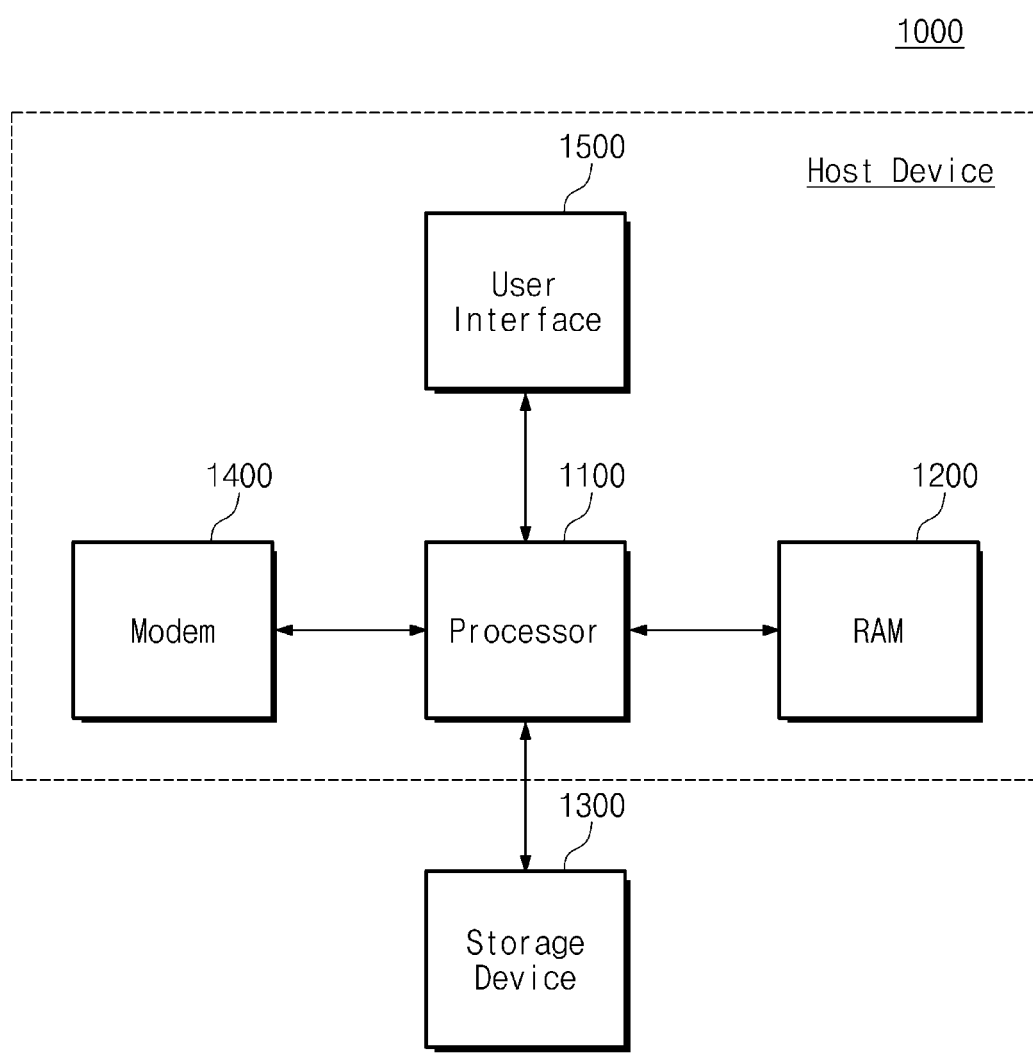
FIG. 35 is a block diagram illustrating a computing device according to an embodiment of the present disclosure.

FIG. 35 is a block diagram illustrating a computing device 1000 according to an embodiment of the present disclosure. Referring to FIG. 35, a computing device 1000 may include a processor 1100, a RAM 1200, a storage device 1300, a modem 1400, and a user interface 1500.

The processor 1100 may control an overall operation of the computing device 100 and may perform a logical operation. The processor 1100 may be a hardware-based data processing device which includes a circuit physically configured to execute operations expressed by commands included in a code or program.

The RAM 1200 may communicate with the processor 1100. The RAM 1200 may be a main memory of the processor 1100 or the computing device 1000. The processor 1100 may store codes or data at the RAM 1200 temporarily.

The storage device 1300 may communicate with the processor 1100. The storage device 1300 may be used to store data for a long time. That is, the processor 110 may store data, which is to be stored for a long time, at the storage device 1300. The storage device 1300 may store a boot image for driving the computing device 1000. The storage device 1300 may include a nonvolatile memory such as a flash memory, a PRAM, an MRAM, an RRAM, or an FRAM.

The modem 1400 may communicate with an external device under control of the processor 1100. The user interface 1500 may communicate with a user under control of the processor 1100.

The storage device 1300 may include one of the storage devices 100, 200, and 300 according to embodiments of the present disclosure. The processor 1100, RAM 1200, modem 1400, and user interface 1500 may constitute a host device that communicates with the storage device.

While the nonvolatile memory device and storage device including the nonvolatile memory device have been described with reference to exemplary embodiments, it will be apparent to those skilled in the art that various changes and modifications may be made without departing from the spirit and scope of the nonvolatile memory device and storage device including the nonvolatile memory device. Therefore, it should be understood that the above embodiments are not limiting, but illustrative.

What is claimed is:

1. A storage device, comprising:
  a nonvolatile memory device; and
  a controller configured to send first data, an address, and a first command to the nonvolatile memory device and further send at least one data to the nonvolatile memory device after sending the first data, the address, and the first command,
  wherein the nonvolatile memory device is configured to initiate a program operation by applying first voltages to selected memory cells, based on the first data, in response to the first command, and before receiving the at least one data, and
  wherein, when receiving the at least one data from the controller, the nonvolatile memory device is configured to continue to perform the program operation by applying second voltages to the selected memory cells based on the first data and the at least one data.

2. The storage device of claim 1, wherein the controller is configured to send second data, the address, and a second command to the nonvolatile memory device after sending the first data, the address, and the first command, and
  wherein, after receiving the second data from the controller, the nonvolatile memory device is configured to continue to perform the program operation by using at least one of the first data and the second data.

3. The storage device of claim 2, wherein the controller is configured to send third data, the address, and a third command to the nonvolatile memory device after sending the second data, the address, and the second command, and
  wherein, after receiving the third data from the controller, the nonvolatile memory device is configured to continue to perform the program operation by using at least one of the first data and the second data in response to the third command.

4. The storage device of claim 3, wherein the first data is programmed as first bits in selected memory cells of the nonvolatile memory device corresponding to the address, the second data is programmed as second bits in the selected memory cells, and the third data is programmed as third bits in the selected memory cells.

5. The storage device of claim 3, wherein the nonvolatile memory device is configured to apply a program voltage of a first program loop to selected memory cells corresponding to the address while receiving the second data, the address, and the second command.

6. The storage device of claim 5, wherein the nonvolatile memory device is configured to classify the selected memory cells into program memory cells and program-inhibit memory cells based on the first data when the program voltage of the first program loop is applied to the selected memory cells.

7. The storage device of claim 5, wherein the nonvolatile memory device is configured to perform a verification read of the first program loop with respect to the selected memory cells while receiving the second data, the address, and the second command.

8. The storage device of claim 7, wherein the verification read of the first program loop is performed by using a verification voltage associated with a program state, among a plurality of program states for the selected memory cells, having a lowest threshold voltage distribution range among threshold voltage distribution ranges for the program states.

9. The storage device of claim 7, wherein after receiving the second data, the address, and the second command, the nonvolatile memory device is configured to perform a dump, which selects an inhibit target of an additional program by using at least one of the first data and the second data, with respect to a result of the verification read.

10. The storage device of claim 5, wherein the nonvolatile memory device is configured to perform a pass-fail check of the first program loop with respect to the selected memory cells after receiving the second data, the address, and the second command.

11. The storage device of claim 5, wherein the nonvolatile memory device is configured to apply a program voltage of a second program loop to the selected memory cells corresponding to the address while receiving the third data, the address, and the third command.

12. The storage device of claim 11, wherein the nonvolatile memory device is configured to classify the selected memory cells into program memory cells and program-inhibit memory cells based on at least one of the first data and the second data when the program voltage of the second program loop is applied to the selected memory cells.

13. The storage device of claim 11, wherein the nonvolatile memory device is configured to perform a verification read of the second program loop with respect to the selected memory cells while receiving the third data, the address, and the third command.

14. The storage device of claim 13, wherein the verification read of the second program loop is performed by using at least one of a first verification voltage associated with a program state, among a plurality of program states for the selected memory cells, having a lowest threshold voltage distribution range among threshold voltage distribution ranges for the program states, and a second verification voltage associated with a program state, among the plurality of program states, having a second lowest threshold voltage distribution range among the threshold voltage distribution ranges for the program states.

15. The storage device of claim 13, wherein after receiving the third data, the address, and the third command, the nonvolatile memory device is configured to perform a dump, which selects an inhibit target of an additional program by using at least one of the first data, the second data, and the third data, with respect to a result of the verification read.

16. The storage device of claim 11, wherein the nonvolatile memory device is configured to perform a pass-fail check of the second program loop with respect to the selected memory cells after receiving the third data, the address, and the third command.

17. The storage device of claim 11, wherein the first program loop and the second program loop are performed without a verification.

18. The storage device of claim 11, wherein the first program loop is performed without a verification and the second program loop comprises a verification using a verification voltage associated with a program state having a lowest threshold voltage distribution range among threshold voltage distribution ranges for a plurality of program states for the selected memory cells.

19. A nonvolatile memory device, comprising:
 a memory cell array comprising a plurality of memory cells;
 a page buffer circuit connected with the plurality of memory cells through bit lines and configured to store data received from an external device; and
 a row decoder circuit connected with the plurality of memory cells through word lines and configured to perform a program operation with respect to memory cells selected from the plurality of memory cells as selected memory cells based on the data stored on the page buffer circuit,
 wherein the row decoder circuit and the page buffer circuit are configured to initiate a program operation, by applying a first voltage to the selected memory cells, when first data is loaded onto the page buffer circuit and before second data and third data are sequentially loaded onto the page buffer circuit, and
 wherein as the second data and the third data are additionally sequentially loaded onto the page buffer circuit, the program operation is sequentially updated and continuously performed by applying a second voltage to the selected memory cells.

20. A method of programming data in a nonvolatile memory device, the method comprising:
 sending first data to the nonvolatile memory device to initiate a program operation before second data is sent to and received by the nonvolatile memory device such that the nonvolatile memory device applies first voltages to selected memory cells based on the first data;
 sending the second data to the nonvolatile memory device to update the program operation while performing the program operation such that the nonvolatile memory device applies second voltages to the selected memory cells based on the first data and the second data; and
 sending third data to the nonvolatile memory device to further update the program operation and continuing to perform the program operation such that the nonvolatile memory device applies second voltages to the selected memory cells based on the first data, the second data and the third data.

* * * * *